United States Patent
Uhlenbrock et al.

(10) Patent No.: US 6,690,055 B1
(45) Date of Patent: Feb. 10, 2004

(54) DEVICES CONTAINING PLATINUM-RHODIUM LAYERS AND METHODS

(75) Inventors: Stefan Uhlenbrock, Boise, ID (US); Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 188 days.

(21) Appl. No.: 09/651,699

(22) Filed: Aug. 30, 2000

Related U.S. Application Data

(60) Division of application No. 09/146,556, filed on Sep. 3, 1998, now Pat. No. 6,271,131, which is a continuation-in-part of application No. 09/140,921, filed on Aug. 26, 1998, now abandoned.

(51) Int. Cl.[7] .............................................. H01L 27/108
(52) U.S. Cl. ...................... 257/310; 257/296; 257/532; 257/768; 257/769
(58) Field of Search ................................ 257/310, 296, 257/532, 751, 768, 769

(56) References Cited

U.S. PATENT DOCUMENTS

| | | |
|---|---|---|
| 3,839,164 A | 10/1974 | Hurst |
| 4,830,982 A | 5/1989 | Dentai et al. |
| 4,992,305 A | 2/1991 | Erbil |
| 5,096,737 A | 3/1992 | Baum et al. |
| 5,130,172 A | 7/1992 | Hicks et al. |
| 5,149,596 A | 9/1992 | Smith et al. |
| 5,187,638 A | 2/1993 | Sandhu et al. |
| 5,198,386 A | 3/1993 | Gonzalez |
| 5,220,044 A | 6/1993 | Baum et al. |
| 5,232,873 A | 8/1993 | Geva et al. |
| 5,252,518 A | 10/1993 | Sandhu et al. |
| 5,270,241 A | 12/1993 | Dennison et al. |
| 5,341,016 A | 8/1994 | Prall et al. |
| 5,354,712 A | 10/1994 | Ho et al. |
| 5,372,849 A | 12/1994 | McCormick et al. |
| 5,392,189 A | 2/1995 | Fazan et al. |
| 5,403,620 A | 4/1995 | Kaesz et al. |
| 5,464,786 A | 11/1995 | Figura et al. |
| 5,478,772 A | 12/1995 | Fazan |
| 5,480,684 A | 1/1996 | Sandhu |
| 5,487,923 A | 1/1996 | Min et al. |
| 5,498,562 A | 3/1996 | Dennison et al. |
| 5,506,166 A | 4/1996 | Sandhu et al. |
| 5,510,651 A | 4/1996 | Maniar et al. |
| 5,520,992 A | 5/1996 | Douglas et al. |
| 5,555,486 A | 9/1996 | Kingon et al. |
| 5,561,307 A | 10/1996 | Mihara et al. |

(List continued on next page.)

FOREIGN PATENT DOCUMENTS

| | | |
|---|---|---|
| EP | 0 301 725 A2 | 2/1989 |
| EP | 0 770 862 | 5/1997 |
| JP | 9 162372 | 6/1997 |

OTHER PUBLICATIONS

Bhatt et al., "Novel high temperature multi-layered electrode barrier structure for high-density ferroelectric memories," *Appl. Phys. Lett.*, 71, 719–721 (1997).

(List continued on next page.)

*Primary Examiner*—George Eckert
*Assistant Examiner*—N. Drew Richards
(74) *Attorney, Agent, or Firm*—Mueting, Raasch & Gebhardt, P.A.

(57) ABSTRACT

A method of forming a rhodium-containing layer on a substrate, such as a semiconductor wafer, using complexes of the formula $L_yRhY_z$ is provided. Also provided is a chemical vapor co-deposited platinum-rhodium alloy barriers and electrodes for cell dielectrics for integrated circuits, particularly for DRAM cell capacitors. The alloy barriers protect surrounding materials from oxidation during oxidative recrystallization steps and protect cell dielectrics from loss of oxygen during high temperature processing steps. Also provided are methods for CVD co-deposition of platinum-rhodium alloy diffusion barriers.

20 Claims, 15 Drawing Sheets

U.S. PATENT DOCUMENTS

| | | | |
|---|---|---|---|
| 5,566,045 | A | 10/1996 | Summerfelt et al. |
| 5,581,436 | A | 12/1996 | Summerfelt et al. |
| 5,605,857 | A | 2/1997 | Jost et al. |
| 5,618,746 | A | 4/1997 | Hwang |
| 5,639,698 | A | 6/1997 | Yamazaki et al. |
| 5,654,222 | A | 8/1997 | Sandhu et al. |
| 5,654,224 | A | 8/1997 | Figura et al. |
| 5,661,115 | A | 8/1997 | Sandhu |
| 5,663,088 | A | 9/1997 | Sandhu et al. |
| 5,679,225 | A | 10/1997 | Pastacaldi et al. |
| 5,691,009 | A | 11/1997 | Sandhu |
| 5,696,384 | A | 12/1997 | Ogi et al. |
| 5,717,250 | A | 2/1998 | Schuele et al. |
| 5,728,626 | A | 3/1998 | Allman et al. |
| 5,744,832 | A | 4/1998 | Wolters et al. |
| 5,760,474 | A | 6/1998 | Schuele |
| 5,790,366 | A * | 8/1998 | Desu et al. ............... 361/305 |
| 5,962,716 | A | 10/1999 | Uhlenbrock et al. |
| 5,970,378 | A | 10/1999 | Shue et al. |
| 5,972,105 | A | 10/1999 | Yamazaki et al. |
| 5,990,559 | A | 11/1999 | Marsh |
| 6,046,469 | A * | 4/2000 | Yamazaki et al. .......... 257/306 |
| 6,074,945 | A | 6/2000 | Vaartstra et al. |
| 6,127,257 | A | 10/2000 | Pintchovski et al. |
| 6,133,159 | A | 10/2000 | Vaartstra et al. |
| 6,201,271 | B1 * | 3/2001 | Okutoh et al. .............. 257/295 |
| 6,218,297 | B1 | 4/2001 | Marsh |
| 6,239,028 | B1 | 5/2001 | Vaartstra |

OTHER PUBLICATIONS

Cohan et al., "Laser–assisted organometallic chemical vapor deposition of films of rhodium and iridium," *Appl. Phys. Lett.*, 60, 1402–1403 (1992).

Doppelt et al., "Mineral precursor for chemical vapor deposition of Rh metallic films," *Mater. Sci. Eng.*, 817, 143–146 (1993).

Etspuler et al., "Deposition of Thin Rhodium Films by Plasma–Enhanced Chemical Vapor Deposition," *Appl. Phys. A*, 48, 373–375 (1989).

Green et al., "Chemical Vapor Deposition of Ruthenium and Ruthenium Dioxide Films," *J. Electrochem. Soc.*, 132, 2677–2685 (1985).

Hoke et al., "Low–temperature Vapour Deposition of High-purity Iridium Coatings from Cyclooctadiene Complexes of Iridium," *J. Mater. Chem.*, 1, 551–554 (1991).

Hsu et al., "Synthesis and X–ray structure of the hetero-nuclear cluster, $(\mu-H)_2(\eta^5-C_5H_5)IrOs_3(CO)_{10}$," *Journal of Organometallic Chemistry*, 426, 121–130 (1992).

Johnson et al., "Chemistry," *Nature*, 901–902 (1967).

Kaesz et al., "Low–Temperature Organometallic Chemical Vapor Deposition of Transition Metals," *Mat. Res. Soc. Symp. Proc.*, 131, 395–400 (1989).

Khakani et al., "Pulsed laser deposition of highly conductive iridium oxide thin films," *Appl. Phys. Lett.*, 69, 2027–2029 (1991).

Kumar et al., "New precursors for organometallic chemical vapor deposition of rhodium," *Can. J. Chem.*, 69, 108–110 (1991).

Liao et al., "Characterization of $RuO_2$ thin films deposited on Si by metal–organic chemical vapor deposition," *Thin Solid Films*, 287, 74–79 (1996).

Lu et al., "Ultrahigh vacuum chemical vapor deposition of rhodium thin films on clean and $TiO_2$–covered Si(111)," *Thin Solid Films*, 208, 172–176 (1992).

Macchioni et al., "Cationic Bis– and Tris($\eta$2–(pyrazol–1–yl)methane) Acetyl Complexes of Iron (II) and Ruthenium (II): Synthesis, Characterization, Reactivity, and Interionic Solution Structure by NOESY NMR Spectroscopy," *Organometallics*, 16, 2139–2145 (1997).

Macomber et al., "The Synthesis and [1] H NMR Study of Vinyl Organometallic Monomers: $(\eta^5-C_5H_4CH=CH_2)M(CO)_2(NO)$ (M = Cr, Mo, W) and $(\eta^5-C_5H_4CH=CH_2)M(CO)_2$(M = Co, Rh, Ir)," *Journal of Organometallic Chemistry*, 250, 311–318 (1983).

Niemer, B., et al., "Organometallic chemical vapor deposition of tungsten metal and suppression of carbon incorporation by codeposition of platinum," *Appl. Phys. Lett.*, 61(15):1793–1795 (1992).

Pathangey et al., "Various approaches have been explored to obtain atomic layer controlled growth, but one of the most straightforward growth techniques is molecular beam epitaxy (MBE)," *Vacuum Technology and Coating*, 33–41 (May 2000).

Rausch et al., "Isolation and Structural Characterization of Bis($\eta^5$–cyclopentadienyl)bis(carbonyl)–$\mu$–(o–phenylene)–diiridium (Ir–Ir), $(C_5H_5)_2Ir_2(C_6H_4)$: A Product Formally Derived from the Double Oxidative Addition of Benzene to Iridium," *J. Amer. Chem. Soc.*, 99, 7870–7876 (1977).

Smith et al., "Low–Temperature Chemical Vapor Deposition of Rhodium and Iridium Thin Films," *Mat. Res. Soc. Symp. Proc.*, 168, 369–374 (1990).

Suntola, "Atomic layer epitaxy," *Thin Solid Films*, 216, 84–89 (1992).

Takasu, Y., et al., "Preparation of a novel $Pt-RuO_2/Ti$ electrocatalyst by use of highly porous ruthenium oxide support prepared from $RuO_2-La_2O_3$/electrode," *Journal of Alloys and Compounds*, 261, 172–175 (1997).

Uchida et al., "Preparation of organoiridium compound for metalorganic chemical vapor deposition (MOCVD) of thin film of iridium or iridium oxide," (Abstract of JP 08,306, 627) *CA Selects: Chemical Vapor Deposition*, 5, 1, Abstract No. 126:89572d (1997).

Van Hemert et al., "Vapor Deposition of Metals by Hydrogen Reduction of Metal Chelates," *J. Electrochem. Soc.*, 112, 1123–1126 (1965).

Versteeg et al., "Metalorganic Chemical Vapor Deposition by Pulsed Liquid Injection Using An Ultrasonic Nozzle: Titanium Dioxide on Sapphire from Titanium (IV) Isopropoxide," *J. Am. Ceram. Soc.*, 78, 2763–2768 (1995).

* cited by examiner

DEVICES CONTAINING PLATINUM-RHODIUM LAYERS AND METHODS

CROSS-REFERENCE TO RELATED APPLICATION

This is a division of application Ser. No. 09/146,556, filed Sep. 3, 1998, (U.S. Pat. No. 6,271,131), which is a continuation-in-part of application Ser. No. 09/140,921, filed Aug. 26, 1998, (abandoned) both of which are incorporated herein by references.

FIELD OF THE INVENTION

The invention relates generally to integrated circuits and more particularly to the use of platinum-rhodium (Pt—Rh) alloy materials for electrodes and diffusion barrier layers to protect cell dielectrics in such circuits. The invention further relates generally to the preparation of rhodium-containing layers on substrates, particularly on semiconductor device structures.

BACKGROUND OF THE INVENTION

Layers of metals and metal oxides, particularly the heavier elements of Group VIII, are becoming important for a variety of electronic and electrochemical applications. For example, high quality $RuO_2$ thin films deposited on silicon wafers have recently gained interest for use in ferroelectric memories. Many of the Group VIII metal layers are generally unreactive toward silicon and metal oxides, resistant to diffusion of oxygen and silicon, and are good conductors. Oxides of certain of these metals also possess these properties, although perhaps to a different extent.

Thus, layers of Group VIII metals and metal oxides, particularly the second and third row metals (e.g., Ru, Os, Rh, Ir, Pd, and Pt) have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors. Rhodium is of particular interest because it is one of a few elements having a resistivity of less than 5 $\mu\Omega$-cm (resistivity at 20° C.=4.51 $\mu\Omega$-cm).

Capacitors are used in a wide variety of integrated circuits. Capacitors are of special concern in DRAM (dynamic random access memory) circuits; therefore, the invention will be discussed in connection with DRAM memory circuits. However, the invention has broader applicability and is not limited to DRAM memory circuits. It may be used in other types of memory circuits, such as SRAMs, as well as any other circuit in which cell dielectrics are used.

There is continuous pressure in the industry to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors. Stacked capacitors are capacitors which are formed over the access transistor in a semiconductor device. In contrast, trench capacitors are formed in the wafer substrate beneath the transistor. For reasons including ease of fabrication and increased capacitance, most manufacturers of DRAMs larger than 4 Megabits use stacked capacitors. Therefore, the present invention will be discussed in connection with stacked capacitors, but should not be understood to be limited thereto.

One widely used type of stacked capacitor is known as a container capacitor. Known container capacitors are in the shape of an upstanding tube (cylinder) with an oval or circular cross section. The wall of the tube consists of two electrodes, i.e., two plates of conductive material, such as doped polycrystalline silicon (referred to herein as polysilicon or poly), separated by a dielectric, such as tantalum pentoxide ($Ta_2O_5$). The bottom end of the tube is closed, with the outer wall in contact with either the drain of the access transistor or a plug which itself is in contact with the drain. The other end of the tube is open. The sidewall and closed end of the tube form a container; hence the name "container capacitor."

The electrodes in a DRAM cell capacitor must protect the dielectric layer from interaction with surrounding materials, including interlayer dielectrics (e.g., BPSG), and from the harsh thermal processing encountered in subsequent steps of DRAM process flow. In order to function well as a bottom electrode, the electrode layer or layer stack must act as an effective barrier to the diffusion of oxygen and silicon. Oxidation of the underlying Si will result in decreased series capacitance, thus degrading the cell capacitor. Platinum is one of the candidates for use as an electrode material for high dielectric capacitors. Platinum, alone, however, is relatively permeable to oxygen. One solution is to alloy the Pt with Rh to enhance the barrier properties of the layer. Physical vapor deposition (PVD) of a Pt—Rh alloy has been shown by H. D. Bhatt et. al., "Novel high temperature multi-layer electrode barrier structure for high-density ferroelectric memories," *Applied Physics Letters*, 71, pp. 719–21 (1997), to provide an improvement over pure Pt for electrode applications. However, PVD deposition does not deliver a layer which is sufficiently conformal for VLSI devices.

Thus, there is a continuing need for methods and materials for the deposition of metal-containing layers, such as rhodium-containing layers, which can function as barrier layers, for example, in integrated circuits. Furthermore, what is needed are capacitor electrodes, barrier layers, and fabrication methods that offer a combination of good conformality, high conductivity, and good barrier properties.

SUMMARY OF THE INVENTION

The present invention is directed to methods for manufacturing a semiconductor device that involve forming a rhodium-containing layer on substrates, such as semiconductor substrates or substrate assemblies during the manufacture of semiconductor structures. The rhodium-containing layer can be a pure rhodium layer, a rhodium oxide layer, a rhodium sulfide layer, a rhodium selenide layer, a rhodium nitride layer, a rhodium alloy layer, or the like. Typically and preferably, the rhodium-containing layer is electrically conductive. The resultant layer can be used as a barrier layer or electrode in an integrated circuit structure, particularly in a memory device such as a DRAM device.

The metal-containing layer can include pure rhodium, or a rhodium alloy containing rhodium and one or more other metals (including transition metals, main group metals, lanthanides) or metalloids from other groups in the Periodic Chart, such as Si, Ge, Sn, Pb, Bi, etc. Furthermore, for certain preferred embodiments, the metal-containing layer can be an oxide, nitride, sulfide, selenide, telluride, or combinations thereof.

Thus, in the context of the present invention, the term "metal-containing layer" includes, for example, relatively pure layers of rhodium, alloys of rhodium with other Group VIII transition metals such as iridium, nickel, palladium, platinum, iron, ruthenium, and osmium, metals other than those in Group VIII, metalloids (e.g., Si), or mixtures thereof. The term also includes complexes of rhodium or rhodium alloys with other elements (e.g., O, N, and S). The terms "single transition metal layer" or "single metal layer" refer to relatively pure layers of rhodium. The terms "transition metal alloy layer" or "metal alloy layer" refer to layers of rhodium in alloys with other metals or metalloids, for example.

One preferred method of the present invention involves forming a layer on a substrate, such as a semiconductor substrate or substrate assembly during the manufacture of a semiconductor structure. The method includes: providing a substrate (preferably, a semiconductor substrate or substrate assembly); providing a precursor composition comprising one or more complexes of the formula:

$$L_y RhY_z,$$ (Formula I)

wherein: each L group is independently a neutral or anionic ligand; each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group and X is a halide; y=1 to 4; z=0 to 4 (preferably, 1 to 4); x=0 to 3; providing a nonhydrogen reaction gas; and forming a metal-containing layer from the precursor composition in the presence of the nonhydrogen reaction gas on a surface of the substrate (preferably, the semiconductor substrate or substrate assembly). The metal-containing layer can be a single transition metal layer or a transition metal alloy layer, for example. Using such methods, the complexes of Formula I are converted in some manner (e.g., decomposed thermally) and deposited on a surface to form a metal-containing layer. Thus, the layer is not simply a layer of the complex of Formula I.

Complexes of Formula I are neutral complexes and may be liquids or solids at room temperature. Typically, however, they are liquids. If they are solids, they are preferably sufficiently soluble in an organic solvent or have melting points below their decomposition temperatures such that they can be used in various vaporization techniques, such as flash vaporization, bubbling, microdroplet formation, etc. However, they may also be sufficiently volatile that they can be vaporized or sublimed from the solid state using known chemical vapor deposition techniques. Thus, the precursor compositions of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material, preferably, however, there is a sufficient amount of the material that can be carried by the organic solvent into the vapor phase for chemical vapor deposition processing.

Yet another method of forming a metal-containing layer on a substrate, such as a semiconductor substrate or substrate assembly during the manufacture of a semiconductor structure, involves: providing a substrate (preferably, a semiconductor substrate or substrate assembly); providing a precursor composition comprising one or more organic solvents and one or more precursor complexes of Formula I as defined above; providing a nonhydrogen reaction gas, preferably an oxidizing gas; vaporizing the precursor composition to form vaporized precursor composition; and directing the vaporized precursor composition toward the substrate to form a metal-containing layer in the presence of a nonhydrogen reaction as on a surface of the substrate. Herein, vaporized precursor composition includes vaporized molecules of precursor complexes of Formula I either alone or optionally with vaporized molecules of other compounds in the precursor composition, including solvent molecules, if used.

Still another method of forming a layer on a substrate involves: providing a substrate; providing a precursor composition comprising one or more complexes of Formula I with the proviso that L is not cyclopentadienyl when Y is CO (particularly, if a hydrogen reaction gas is provided); and forming a rhodium-containing layer from the precursor composition on a surface of the substrate.

Preferred embodiments of the methods of the present invention involve the use of one or more chemical vapor deposition techniques, although this is not necessarily required. That is, for certain embodiments, spin-on coating, dip coating, etc., can be used.

Methods of the present invention are particularly well suited for forming layers on a surface of a semiconductor substrate or substrate assembly, such as a silicon wafer, with or without layers or structures formed thereon, used in forming integrated circuits. It is to be understood that methods of the present invention are not limited to deposition on silicon wafers; rather, other types of wafers (e.g., gallium arsenide wafers, etc.) can be used as well. Also, for certain embodiments the methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A chemical vapor deposition system is also provided. The system includes a deposition chamber having a substrate positioned therein; a vessel containing a precursor composition comprising one or more complexes of Formula I as described above; a source of an inert carrier gas for transferring the precursor composition to the chemical vapor deposition chamber; and a source of a nonhydrogen reaction gas.

The present invention also provides platinum-rhodium (Pt—Rh) alloy barrier layers and methods for fabricating capacitors and other devices containing such barrier layers in order to protect cell dielectrics, such as $Ta_2O_5$, $SrTiO_3$ ("ST"), $(Ba,Sr)TiO_3$ ("BST"), $Pb(Z,Ti)O_3$ ("PZT"), $SrBi_2Ta_2O_9$ ("SBT") and $Ba(Zr,Ti)O_3$ ("BZT"), against dielectric degradation through thermal effects and interaction with surrounding materials.

The chemical vapor deposited Pt—Rh co-deposited alloy layers of the invention provide excellent barrier protection, conductivity as capacitor electrodes, and conformality, and so may be employed either as capacitor electrodes, or as separate barrier layers formed adjacent to conventional capacitor electrodes, either atop these electrodes or interposed between the electrode and the capacitor dielectric. Preferably, the CVD Pt—Rh alloy layer according to the invention comprises a thin barrier layer between a cell dielectric and an underlying polysilicon (poly) plug or drain in a DRAM cell array, as well as acting as a lower electrode. The term "CVD platinum-rhodium alloy" herein means a material layer containing platinum and rhodium in the compositional ranges and having the characteristic high degree of conformality described herein.

The present invention also provides a co-deposition method for forming CVD Pt—Rh barrier films using a platinum precursor composition, a rhodium precursor composition, and reaction gases for causing chemical vapor co-deposition of a Pt—Rh alloy in a CVD reactor.

DETAILED DESCRIPTION OF PREFERRED EMBODIMENTS

The present invention provides methods of forming a rhodium-containing layer, preferably an electrically conductive rhodium-containing layer, (e.g., pure rhodium, rhodium oxide, rhodium sulfide, rhodium selenide, rhodium nitride, or alloys of rhodium, particularly rhodium-platinum alloys, etc.). Specifically, the present invention is directed to methods of manufacturing a semiconductor device, particularly a ferroelectric device, having a rhodium-containing layer. The rhodium-containing layers formed are preferably conductive and can be used as barrier layers between the dielectric material and the silicon substrate in memory devices, such as ferroelectric memories, or as the plate (i.e., electrode) itself in the capacitors, for example. Because they are generally unreactive, such layers are also suitable for use in optics applications as a reflective coating or as a high temperature oxidation barrier on carbon composites, for example. They can be deposited in a wide variety of thicknesses, depending on the desired use.

The present invention provides methods of forming a metal-containing layer using one or more rhodium complexes. These rhodium complexes are typically mononuclear (i.e., monomers in that they contain one metal per molecule), although they can be in the form of weakly bound dimers (i.e., dimers containing two monomers weakly bonded together through hydrogen or dative bonds). Herein, such monomers and weakly bound dimers are shown as mononuclear complexes.

An example of a fabrication process for a capacitor according to one embodiment of the present invention is described below. It is to be understood, however, that this process is only one example of many possible configurations and processes utilizing the rhodium-containing layers (e.g., Pt—Rh barriers or electrodes) of the invention. For example, in the process described below, a Pt—Rh alloy material is utilized as a barrier below the bottom electrode of a capacitor. Alternatively, the top electrode may also include a Pt—Rh alloy barrier material.

Furthermore, doped poly or other conventional electrode materials may be provided with a Pt—Rh layer atop the electrode, between the electrode and the dielectric, in both locations, or the Pt—Rh alloy material itself may form one or both electrodes in lieu of conventional electrode materials. In addition, in the process described below the bit line is formed over the capacitor. A buried bit-line process could also be used. As another example, the plugs under the capacitors formed by the following process could be eliminated. Also, dry or wet etching could be used rather than chemical mechanical polishing. The invention is not intended to be limited by the particular process described below.

Figure 1:
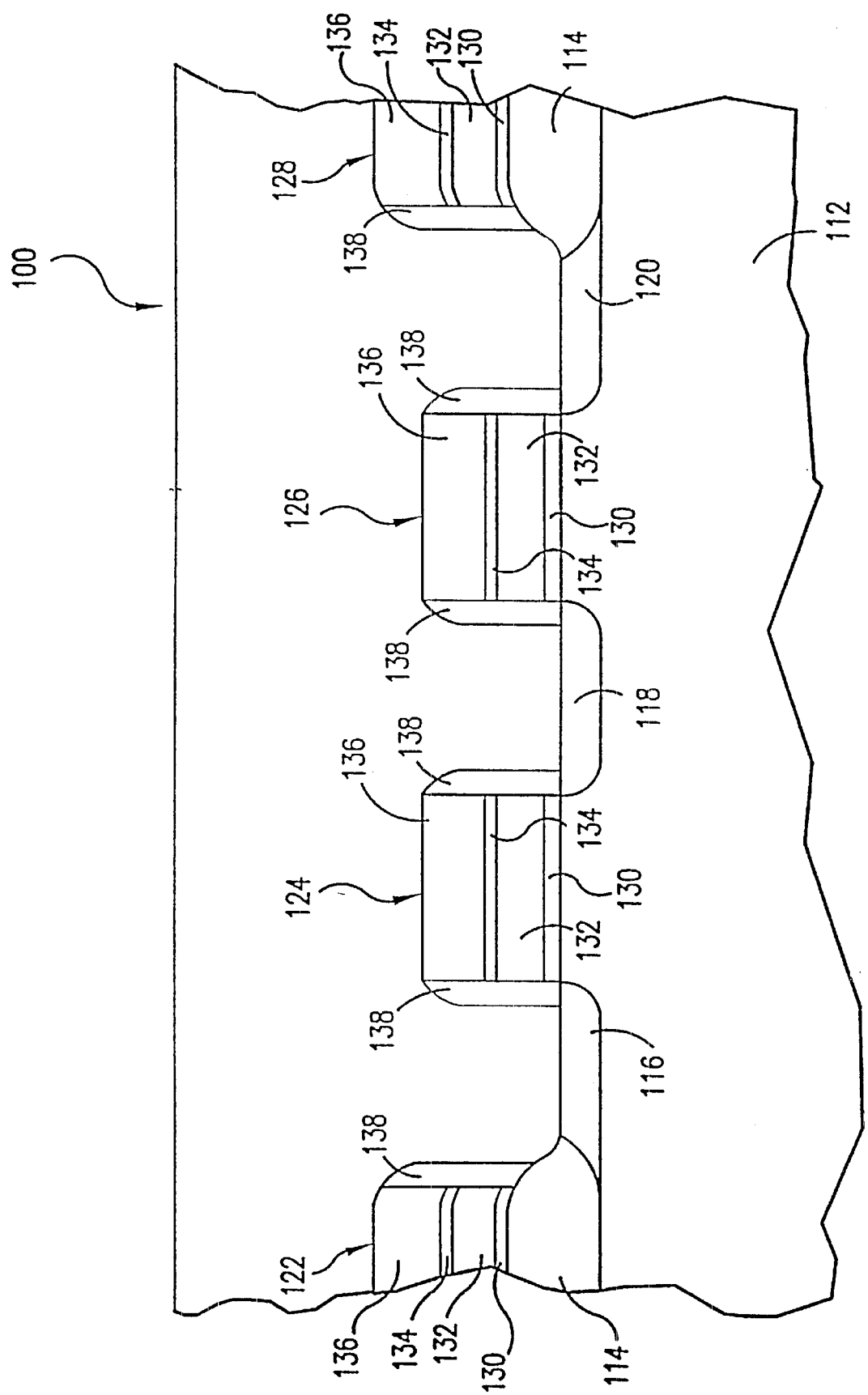
FIG. 1 is a diagrammatic cross-sectional view taken along a portion of a semiconductor wafer at an early processing step according to one embodiment of the present invention.

Referring to FIG. 1, a semiconductor wafer fragment at an early processing step is indicated generally by reference numeral 100. The semiconductor wafer 100 is comprised of a bulk silicon substrate 112 with field isolation oxide regions 114 and active areas 116, 118, 120. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, also of silicon nitride.

Two FETs are depicted in FIG. 1. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed.

Figure 2:
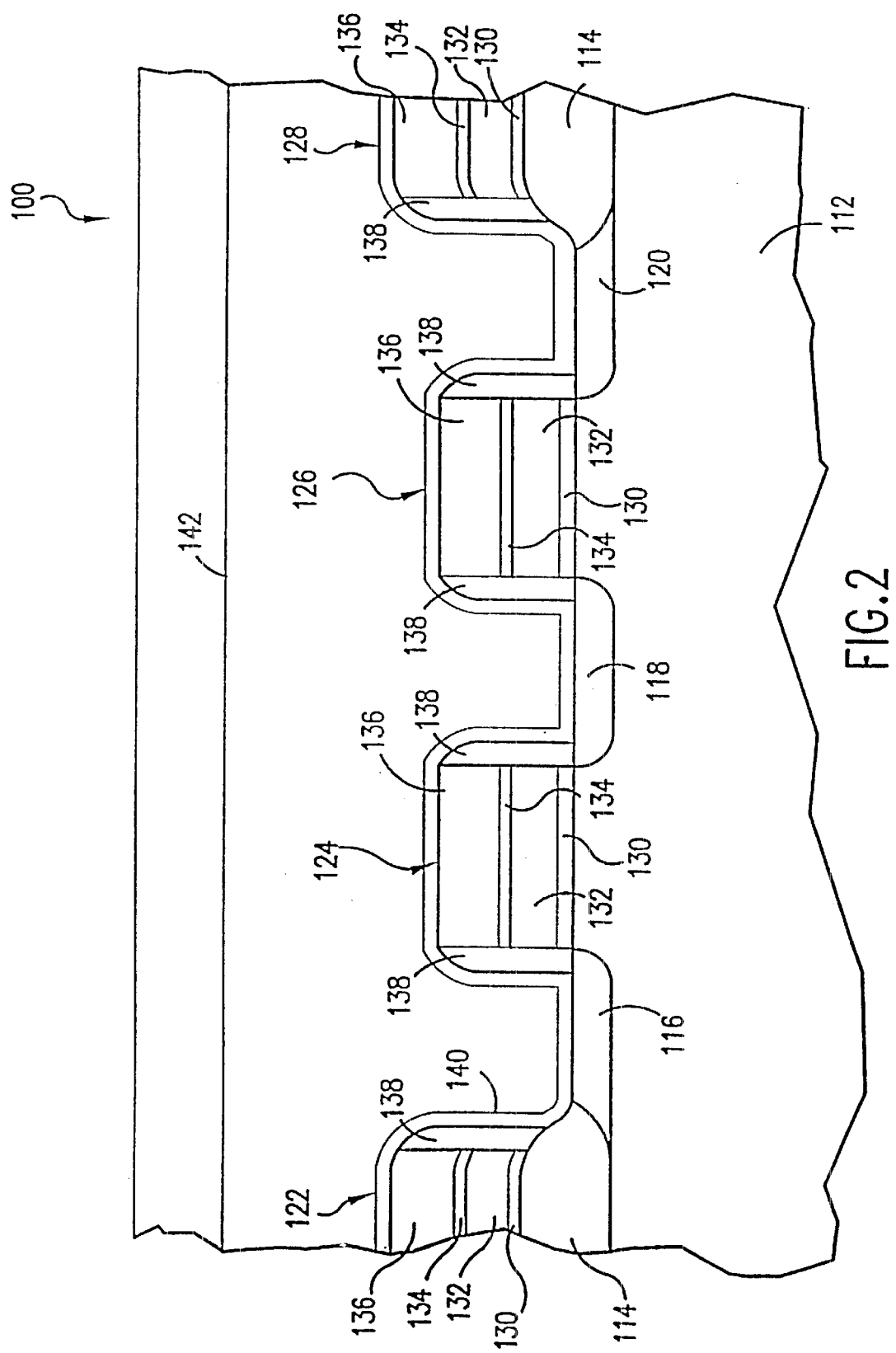
FIG. 2 is a diagrammatic cross-sectional view of a portion of a semiconductor wafer at a processing step subsequent to that shown in FIG. 1.

Referring to FIG. 2, a thin film 140 of nitride or TEOS is provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 3:
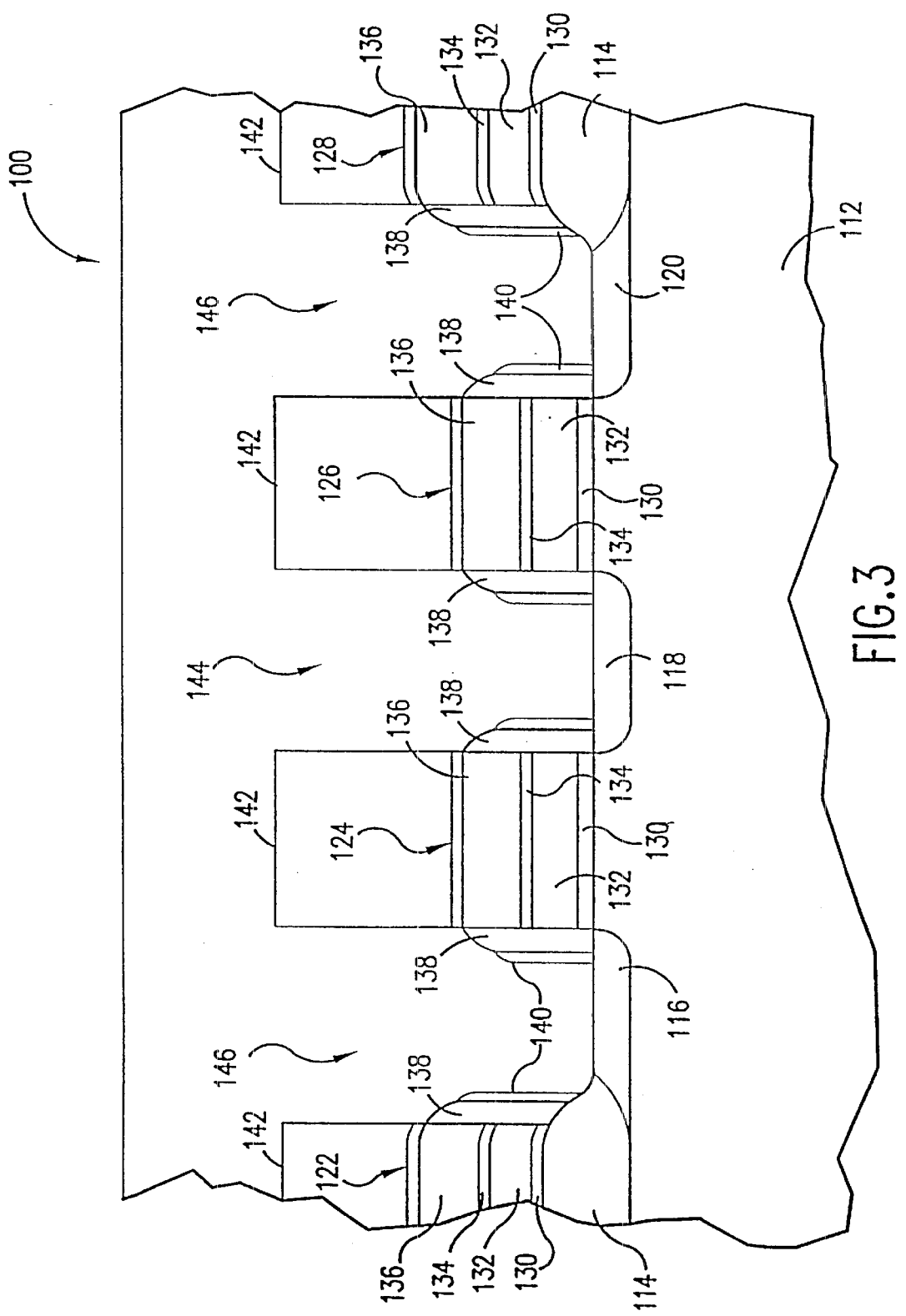
FIG. 3 is a diagrammatic cross-sectional view of a portion of a semiconductor wafer at a processing step subsequent to that shown in FIG. 2.
Figure 4:
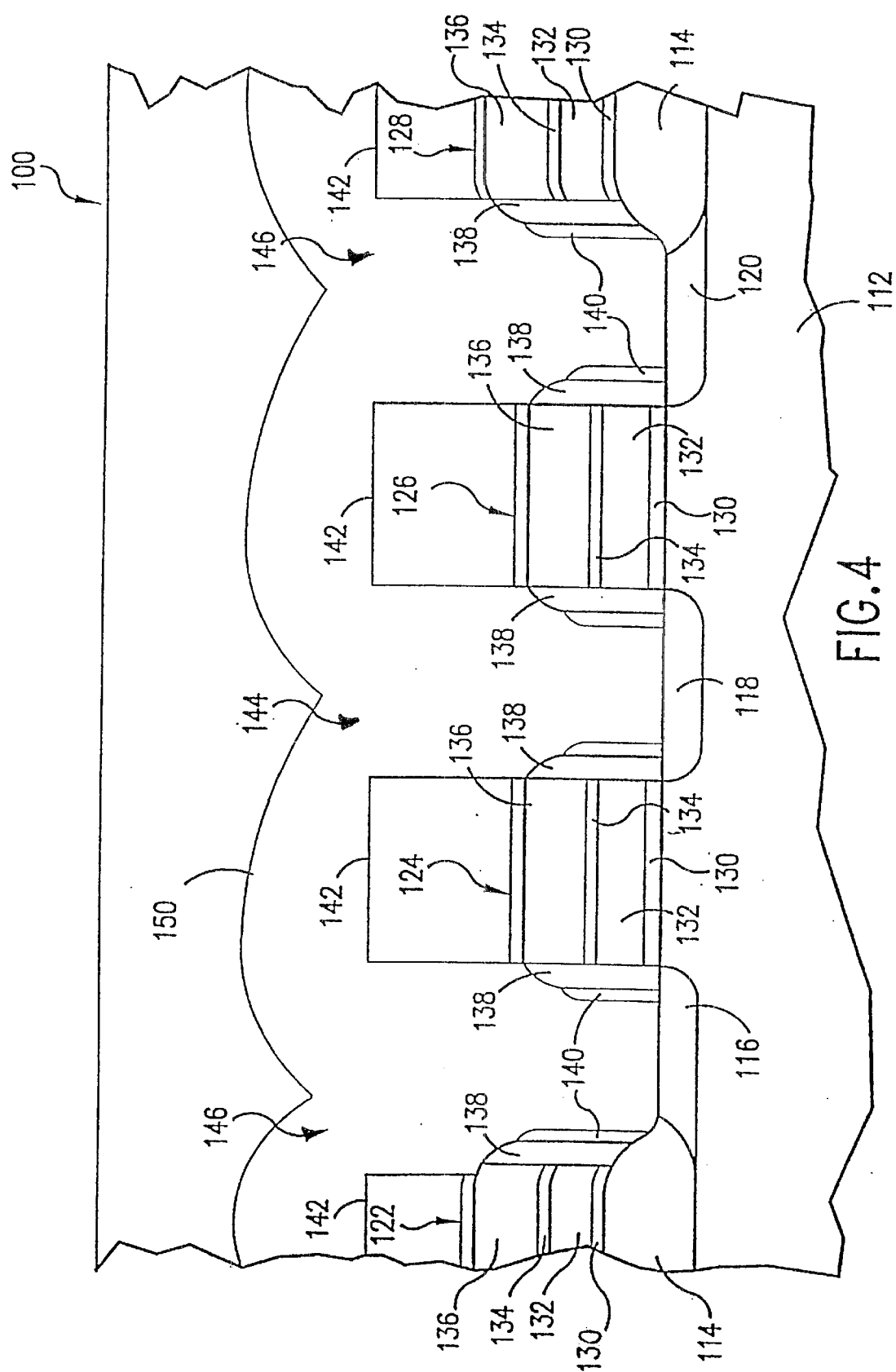
FIG. 4 is a diagrammatic cross-sectional view of a portion of a semiconductor wafer processing step subsequent to that shown in FIG. 3.
Figure 5:
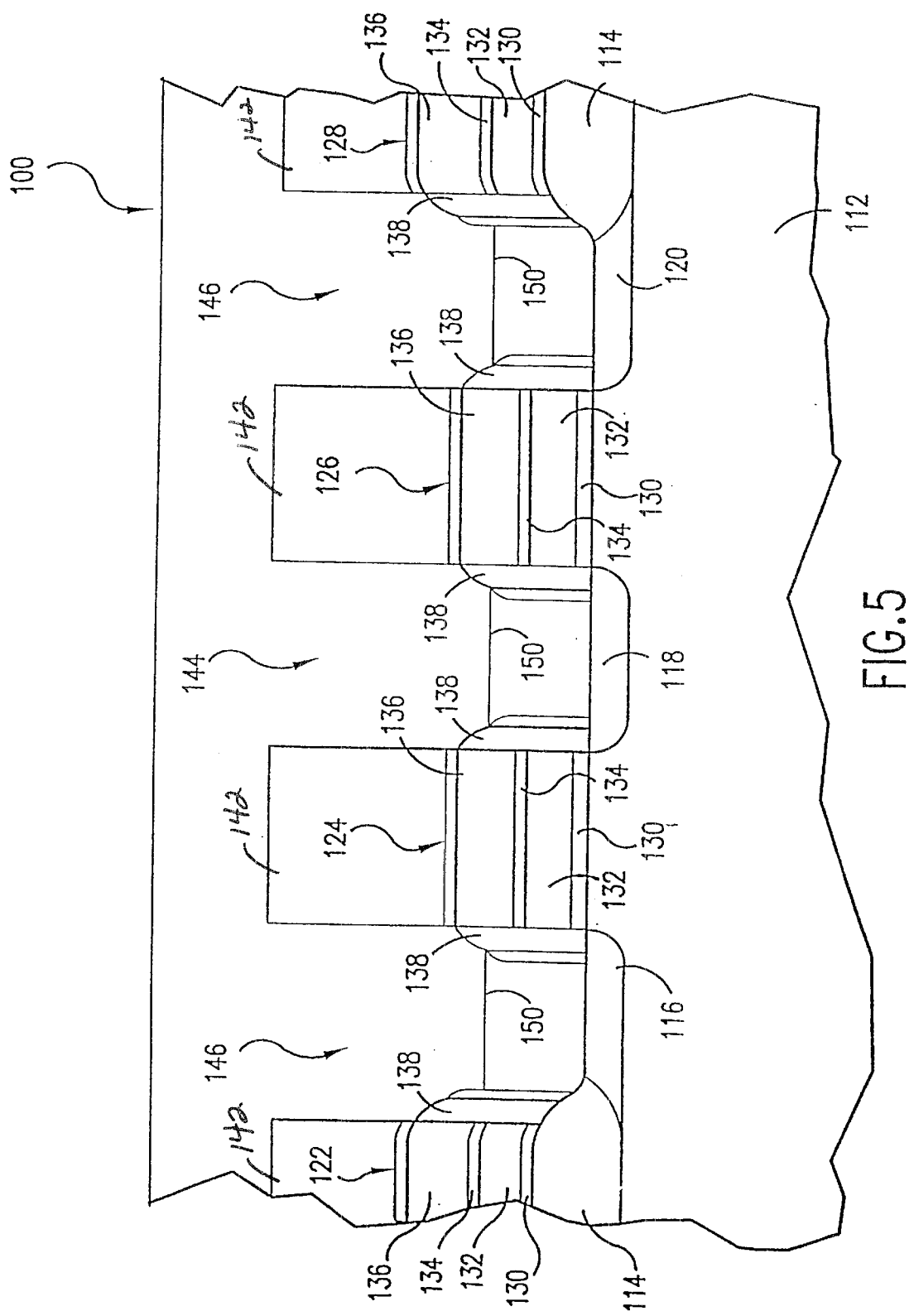
FIG. 5 is a diagrammatic cross-sectional view of a portion of a semiconductor wafer a processing step subsequent to that shown in FIG. 4.

Referring to FIG. 3, a bit line contact opening 144 and capacitor openings 146 have been formed through the insulating layer 142. The openings 144, 146 are formed through the insulating layer 142 by photomasking and dry chemical etching the BPSG relative to the thin nitride or TEOS layer 140. Referring now to FIG. 4, a layer 150 of conductive material is deposited to provide conductive material within the bit line contact opening 144 capacitor openings 146. The conductive layer 150 is in contact with the active areas 116, 118, 120. An example of the material used to form layer 150 is in situ arsenic or phosphorous doped poly. Referring now to FIG. 5, the conductive layer 150 is etched away to the point that the only remaining material forms plugs 150 over the active areas 116, 118, 120.

Figure 6:
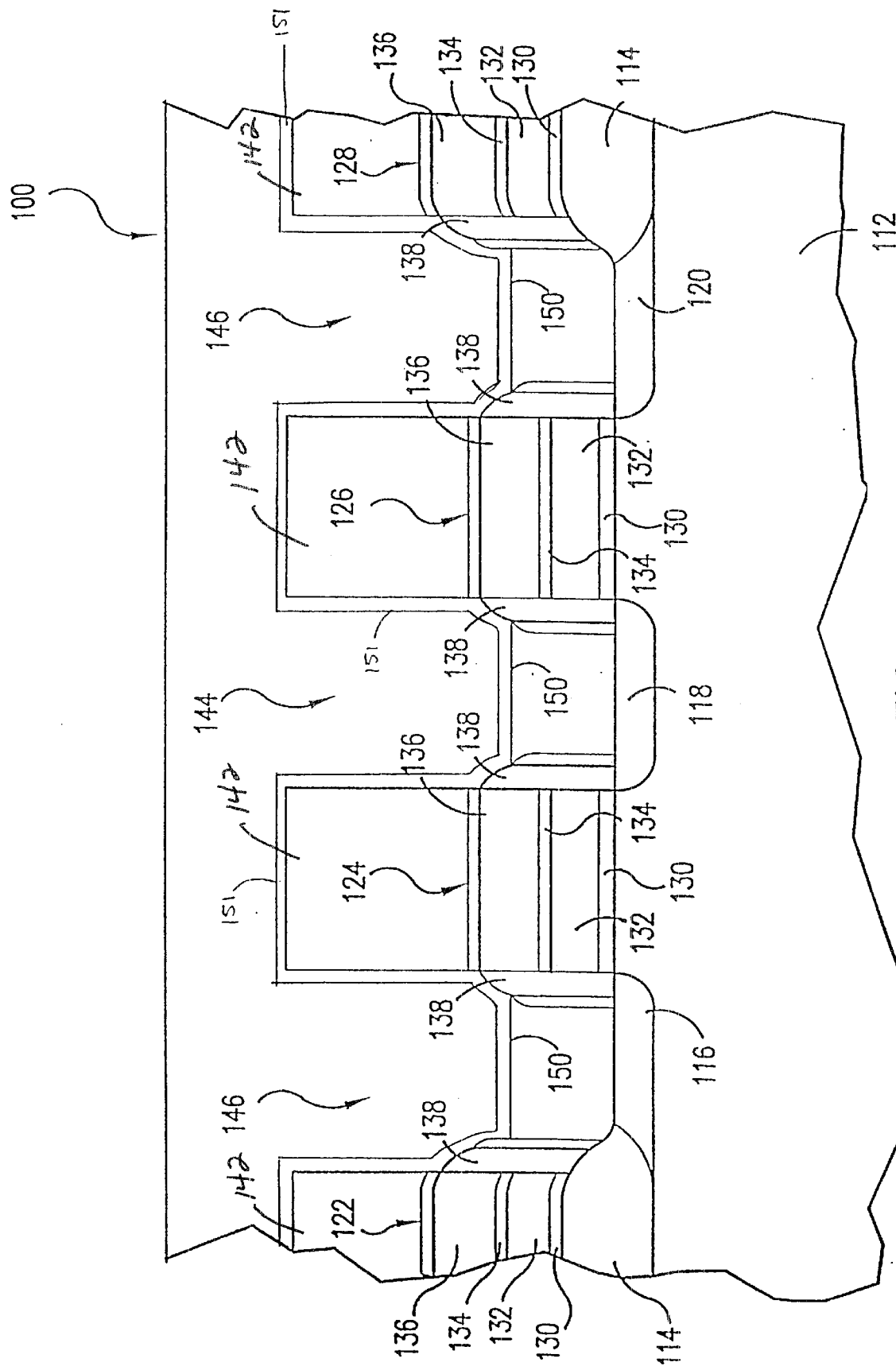
FIG. 6 is a diagrammatic cross-sectional view of a portion of a semiconductor wafer a processing step subsequent to that shown in FIG. 5.

Referring now to FIG. 6, a thin barrier layer 151 of a Pt—Rh alloy is formed as a barrier layer atop conductive layer 150. Barrier layer 151 is co-deposited by CVD to form a conformal layer which protects the subsequently deposited capacitor dielectric against diffusion from underlying plug 150 and other surrounding materials. Perhaps more importantly for some applications of the invention, barrier layer 151 also protects the underlying plug 150 from diffusion of oxygen from the capacitor dielectric. Chemical vapor deposition techniques are desired because they are more suitable for deposition on semiconductor substrates or substrate assemblies, particularly in contact openings which are extremely small and require conformally filled layers of metal.

The co-deposition process includes the use of separate platinum and rhodium precursors for CVD. Any platinum and rhodium complexes suitable for deposition via CVD may be used in the process of the invention. The rhodium precursor (whether for the preferred Pt—Rh co-deposition process or for other deposition processes described herein) is preferably of the following formula, which is shown as a monomer, although weakly bound dimers are also possible:

$L_y RhY_z$,  (Formula I)

wherein: each L group is independently a neutral or anionic ligand; each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group and X is a halide; y=1 to 4 (preferably, 1); z=0 to 4 (preferably, 1 to 4, more preferably, 2 or 3, and most preferably, 2); and x=0 to 3.

A particularly preferred rhodium precursor, particularly for the preparation of Pt—Rh alloys, is a rhodium complex as shown in Formula II:

CpRh(CO)$_2$  (Formula II)

where Cp is cyclopentadienyl.

The platinum precursor is preferably a platinum complex as shown in Formula III:

MeCpPt(Me)$_3$  (Formula III)

where Me is a methyl group and Cp is cyclopentadienyl. Other platinum complexes that can be used in addition or in place of the complex of Formula III include, for example, Pt(CO)$_2$Cl$_2$, Pt(CH$_3$)$_2$[(CH$_3$)NC], (COD)Pt(CH$_3$)$_2$, (COD)Pt(CH$_3$)Cl, (C$_5$H$_5$)Pt(CH$_3$)(CO), (acac)(Pt)(CH$_3$)$_3$, wherein COD=1,5 cyclooctadiene and acac=acetylacetonate.

For certain embodiments, the precursor compositions may be used in the range of from about 0.5% to 99.5% rhodium precursor, more preferably about 2% to 10% rhodium precursor, and most preferably, about 5% Formula II (Rh) and 95% Formula III (Pt).

In Formula I above, each L ligand is a neutral or anionic ligand, which can include pi bonding ligands. Preferably, L is selected from the group of dialkyl- and trialkyl-amines, polyamines (e.g., N,N,N'N'N"-pentamethyldiethylenetriamine, diethylenetriamine), trialkylphosphines, trialkylphosphites, ethers (including linear, branched, and cyclic ethers and polyethers), unsubstituted or fluoro-substituted linear, branched, and cyclic (alicyclic) alkyls, substituted or unsubstituted linear, branched, or cyclic (alicyclic) alkenes (including monoenes, dienes, trienes, bicyclic alkenes, and polyenes, such as cyclopentadiene (Cp), cyclooctadiene, benzene, toluene, and xylene), substituted or unsubstituted linear, branched, and cyclic (alicyclic) alkynes, alkoxy groups (e.g., methoxy, ethoxy, isopropoxy), allyls, carboxylates, diketonates, thiolates, halides, substituted silanes (including alkoxy substituted silanes, alkyl substituted silanes, alkenyl substituted silanes), as well as oxo, nitrile, isonitrile, cyano, and carbonyl ligands. Various combinations of such L groups can be present in a molecule. Preferably, at least two different ligands are present in each complex. More preferably, L is not a cyclopentadienyl ligand when Y is a carbonyl ligand in the presence of a hydrogen reaction gas. Most preferably, L is a cyclopentadienyl ligand when Y is a carbonyl ligand in the presence of an oxidizing reaction gas.

Preferably, each R group in the complexes of Formula I is a ($C_1$–$C_8$) organic group. More preferably, each R group is a ($C_1$–$C_5$) organic group. Most preferably, each R group is a ($C_1$–$C_4$) alkyl moiety.

As used herein, the term "organic group" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present invention, the organic groups are those that do not interfere with the formation of a metal-containing layer. Preferably, they are of a type and size that do not interfere with the formation of a metal-containing layer using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group (such as a cyclic alkyl) having properties resembling those of aliphatic groups. The term "aromatic group" or "aryl group" means a mono- or polynuclear aromatic hydrocarbon group. The term "heterocyclic-group" means a closed ring hydrocarbon in which one or more of the atoms in the ring is an element other than carbon (e.g., nitrogen, oxygen, sulfur, etc.).

Substitution is anticipated on the organic groups of the complexes of the present invention. As a means of simplifying the discussion and recitation of certain terminology used throughout this application, the terms "group" and "moiety" are used to differentiate between chemical species that allow for substitution or that may be substituted and those that do not allow or may not be so substituted. Thus, when the term "group" is used to describe a chemical substituent, the described chemical material includes the unsubstituted group and that group with O, N, Si, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

A preferred class of complexes of Formula I include $(RC_5H_4)Rh(CO)_2$, where R represents one or more substituents such as methyl, ethyl, vinyl, etc., on the cyclopentadienyl group. This class of complexes of Formula I is particularly advantageous because they are highly volatile compounds and suitable for CVD techniques.

Methods of the present invention can be used to deposit a metal-containing layer, preferably a metal or metal alloy layer (e.g., Pt—Rh alloy), on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The layer is deposited upon decomposition (typically, thermal decomposition) of a complex of Formula I, preferably one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

Figure 12:
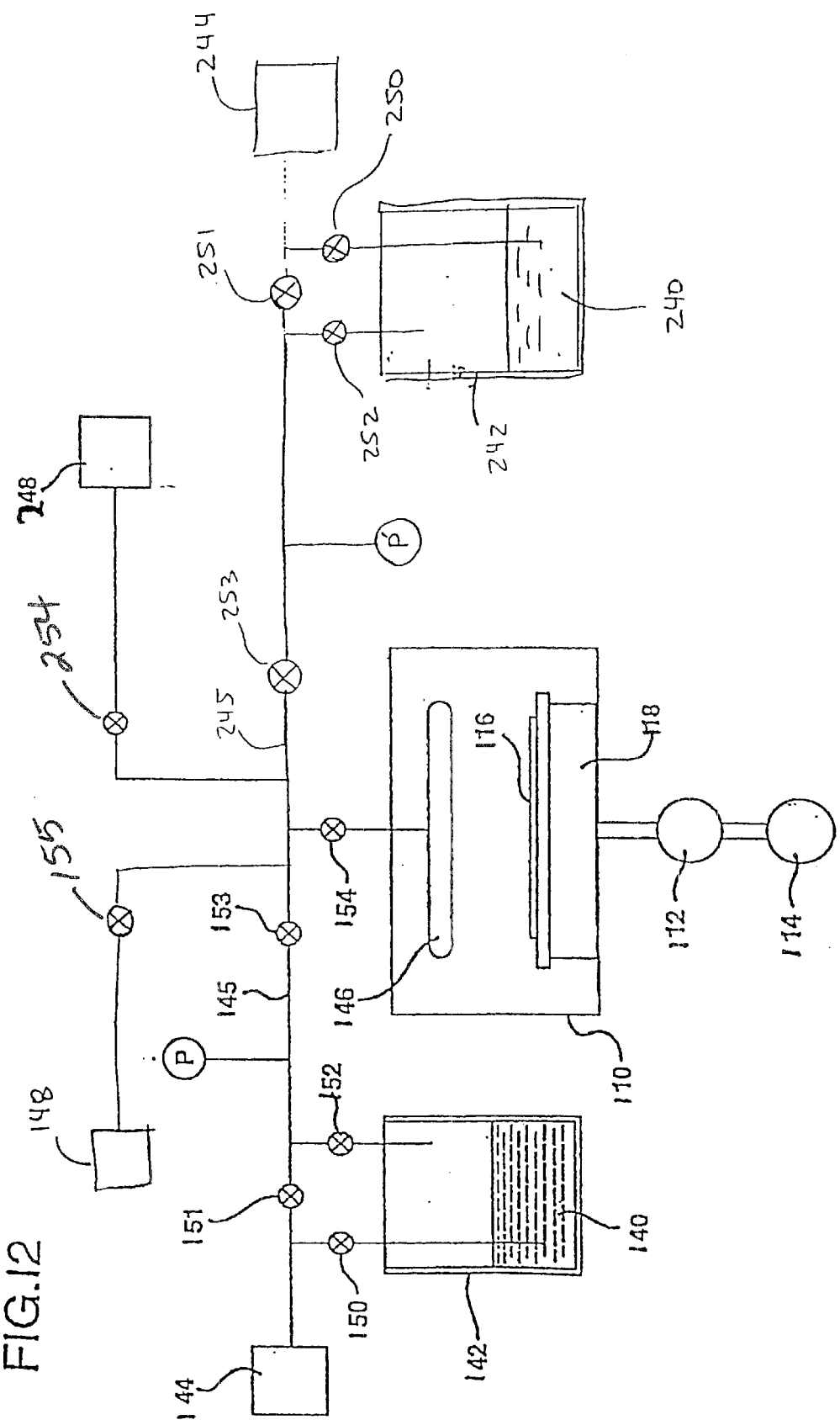
FIG. 12 is a schematic of a chemical vapor co-deposition system suitable for use in the method of the present invention.

A typical chemical vapor deposition (CVD) system that can be used to perform the process of the present invention is shown in FIG. 12. The system includes an enclosed chemical vapor deposition chamber 110, which may be a cold wall-type CVD reactor. The CVD process may be carried out at pressures of from atmospheric pressure down to about $10^{-3}$ torr, and preferably from about 10 torr to about 0.1 torr. A vacuum may be created in chamber 110 using turbo pump 112 and backing pump 114, or simply a dry backing pump.

One or more substrates 116 (e.g., semiconductor substrates or substrate assemblies) are positioned in chamber 110. A constant nominal temperature is established for the substrate, preferably at a temperature of about 50° C. to about 600° C. More preferably, the temperature is about 50° C. to about 400° C. for certain embodiments, and for other embodiments (e.g., the preparation of Pt—Rh alloys) it is about 200° C. to about 500° C. Substrate 116 may be heated, for example, by an electrical resistance heater 118 on which substrate 116 is mounted. Other known methods of heating the substrate may also be utilized. The term "substrate" herein shall be understood to mean one or more semiconductive layers or structures which may include active or operable portions of semiconductor devices.

In this process, the platinum precursor composition 140, which contains one or more complexes of, for example, Formula III (and/or other metal or metalloid complexes), is stored in liquid form (a neat liquid at room temperature or at an elevated temperature if solid at room temperature) in vessel 142. Vessel 142 is preferably maintained at a temperature above about 0° C., more above about 30° C., and most preferably above about 33° C. A source 144 of a suitable inert gas is pumped into vessel 142 and bubbled through the neat liquid (i.e., without solvent) picking up the precursor composition and carrying it into chamber 110 through line 145 and gas distributor 146. Additional inert carrier gas or reaction gas may be supplied from source 148 as needed to provide the desired concentration of precursor composition and regulate the uniformity of the deposition across the surface of substrate 116. As shown, a series of valves 150–155 are opened and closed as required.

The rhodium precursor composition 240, which contains one or more complexes of, for example, Formula I, and preferably, Formula II (and/or other metal or metalloid complexes, such as $MeCpRh(CO)_2$), is stored in liquid form (a neat liquid at room temperature or at an elevated temperature if solid at room temperature) in vessel 242. The temperature in vessel 242 is preferably above about −20° C., and more preferably above about 5° C. or more. A source 244 of a suitable inert gas is pumped into vessel 242 and bubbled through the neat liquid (i.e., without solvent) picking up the precursor composition and carrying it into chamber 110 through line 245 and gas distributor 146. Additional inert carrier gas or reaction gas may be supplied from source 248 as needed to provide the desired concentration of precursor composition and regulate the uniformity of the deposition across the surface of substrate 116. As shown, a series of valves 154, and 250–254 are opened and closed as required.

Generally, the precursor compositions are directed into the CVD chamber 110 using an inert carrier gas, at a flow rate of about 1 sccm (standard cubic centimeters per minute) to about 1000 sccm. The respective flow rates of platinum and rhodium precursors and carrier gases from vessels 142 and 242, respectively, are varied to provide the desired ratio of Pt to Rh in the as co-deposited layer. The semiconductor substrate is typically exposed to the precursor compositions at a pressure of about 0.001 torr to about 100 torr for a time of about 0.01 minute to about 100 minutes. In chamber 110, the precursor compositions will form an absorbed layer on the surface of the substrate 116. As the co-deposition rate is temperature dependent, increasing the temperature of the substrate will increase the rate of co-deposition. Typical co-deposition rates are about 10 Angstroms/minute to about 1000 Angstroms/minute. The carrier gases containing the precursor compositions are terminated by closing valves 153 and 253.

In an alternative process, one or more solutions of one or more platinum and rhodium precursor compositions (and/or other metal or metalloid complexes) are stored in vessels and transferred to a mixing manifold using pumps. The resultant precursor composition mixture is then transferred to a vaporizer, to volatilize the precursor composition mixture. A source of a suitable inert gas is pumped into the vaporizer for carrying the volatilized precursor composition mixture into chamber 110. Reaction gas is supplied as needed.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Although a specific vapor deposition process is described by reference to FIG. 12, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

Various combinations of carrier gases and/or reaction gases can be used in certain methods of the present invention. They can be introduced into the chemical vapor deposition chamber in a variety of manners, such as directly into vaporization chamber or in combination with one or more of the precursor compositions.

The Pt and Rh precursors according to the invention are preferably neutral complexes and may be liquids or solids at room temperature. Typically, they are liquids. If solids, they should be sufficiently soluble in an organic solvent to allow for vaporization, can be vaporized from the solid state, or have melting temperatures below their decomposition temperatures. The precursors are suitable for use in chemical vapor deposition techniques, such as flash vaporization techniques, bubbler techniques, and microdroplet techniques. The preferred precursors described herein are particularly suitable for low temperature CVD, e.g., deposition techniques involving temperatures of about 250° C.

The precursor composition can be vaporized in the presence of an inert carrier gas and/or a reaction gas (i.e., reacting gas) to form a relatively pure rhodium layer, a rhodium alloy layer, or other rhodium-containing layer. The inert carrier gas is typically selected from the group consisting of nitrogen, helium, argon, and mixtures thereof. In the context of the present invention, an inert carrier gas is one that is generally unreactive with the complexes described herein and does not interfere with the formation of a rhodium-containing layer (e.g., Pt—Rh film). The reaction gas can be selected from a wide variety of gases reactive with the complexes described herein, at least at a surface under the conditions of chemical vapor deposition. Examples of reaction gases include hydrogen and nonhydrogen gases. As used herein, a nonhydrogen reaction gas is one that does not include dihydrogen. Preferably, the reaction gas is a nonhydrogen gas. Examples include, oxidizing gases selected from the group of $O_2$, $O_3$, $SO_3$, $H_2O$, $H_2O_2$, nitrogen oxides, organic peroxides, $RuO_4$, and combinations thereof; reducing gases selected from the group of $NH_3$, $N_2H_4$, and combinations thereof; and gases selected from the group of $SiH_4$, $Si_2H_6$, $H_2S$, $H_2Se$, $H_2Te$, and combinations thereof. For certain preferred embodiments, the reacting gas is selected from the group consisting of organic peroxides, $O_2$, $O_3$, NO, $N_2O$, SO, $H_2$, $NH_3$, and $H_2O_2$. Various combinations of carrier gases and/or reaction gases can be used in the methods of the present invention to form rhodium-containing layers. Thus, the rhodium-containing layer can include an oxide, nitride, ect., or combinations thereof. Such metal-containing layers can also be formed by subjecting a relatively pure metal layer to subsequent processing to form other metal-containing layers. Significantly, an oxidizing gas can be used to form a relatively pure rhodium layer without oxygen or carbon incorporation.

Various complexes can be used in a precursor composition. Thus, as used herein, a "precursor composition" refers to a liquid or solid that includes one or more complexes of the formulas described herein optionally mixed with one or more complexes of formulas other than those of Formulas I, II, and III. The precursor compositions can also include one or more organic solvents suitable for use in a chemical vapor deposition system, as well as other additives, such as free ligands, that assist in the vaporization of the desired compounds.

The solvents that are suitable for this application can be one or more of the following: saturated or unsaturated linear, branched, or cyclic aliphatic (alicyclic) hydrocarbons ($C_3$–$C_{20}$, and preferably $C_5$–$C_{10}$), aromatic hydrocarbons ($C_5$–$C_{20}$, and preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitriles, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. The complexes are also generally compatible with each other, so that mixtures of variable quantities of the complexes will not interact to significantly change their physical properties.

One preferred method of the present invention involves vaporizing (preferably, by a bubbling technique) a precursor composition that includes one or more rhodium complexes. Also, the precursor composition can include complexes containing other metals or metalloids, particularly if flash vaporization is the vaporizing technique.

The complexes described herein can be used in precursor compositions for chemical vapor deposition. Alternatively, certain complexes described herein can be used in other deposition techniques, such as spin-on coating, dip coating, and the like. Typically, those complexes containing R groups with a low number of carbon atoms (e.g., 1–4 carbon atoms per R group) are suitable for use with vapor deposition techniques. Those complexes containing R groups with a higher number of carbon atoms (e.g., 5–12 carbon atoms per R group) are generally suitable for spin-on or dip coating. Preferably, however, chemical vapor deposition techniques are desired because they are more suitable for deposition on semiconductor substrates or substrate assemblies, particularly in contact openings which are extremely small and require conformally filled layers of metal.

For the preparation of rhodium alloy layers, at least one complex of Formula I can be combined with another complex in a precursor composition or they can be provided in separate bubblers or vaporizers, for example (e.g., MeCpRh$(CO)_2$ and CyclohexadieneRu$(CO)_3$ for a Rh/Ru alloy).

The precursor compositions for use in the present invention can be prepared by a variety of methods. For example, rhodium precursors can be prepared by reacting NaCp with [RhCl$(CO)_2]_2$ In addition, the precursors for platinum co-deposition may be purchased from, e.g., Strem Chemical Co.

Figure 7:
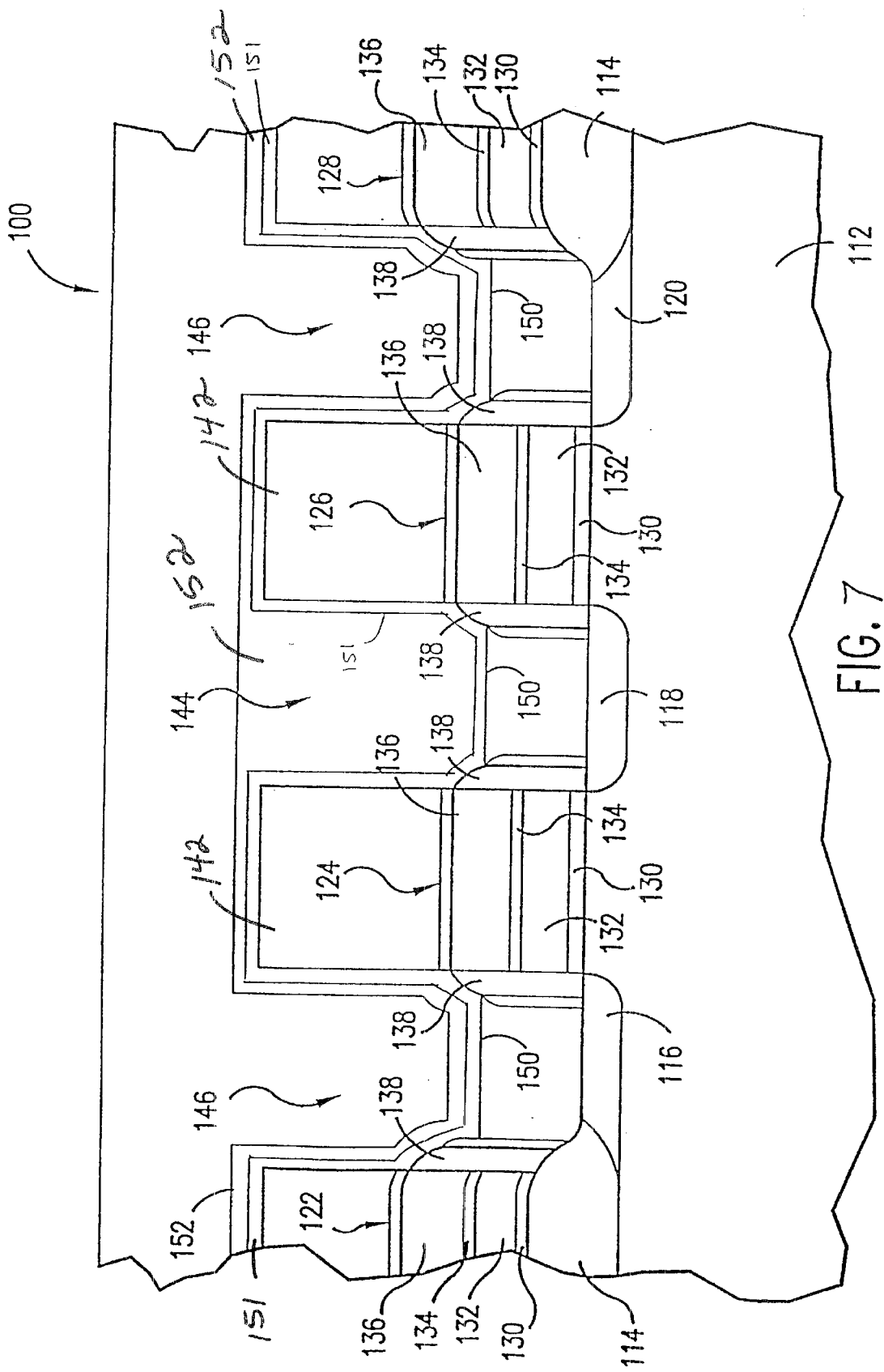
FIG. 7 is a diagrammatic cross-sectional view of a portion of a semiconductor at a processing step subsequent to that shown in FIG. 6.

Following chemical vapor co-deposition of barrier layer 151, a layer 152 of conductive material that will eventually form one of the electrodes of the capacitor is deposited at a thickness such that the capacitor openings, 146 are not closed off. Referring to FIG. 7, the layer 152 may be formed of various refractory metals, conductive metal oxides, metal nitrides, noble metals and may include, such as, Pt, Rh, Ir, Ru, Os, Pd, $IrO_2$, $RhO_2$, $RuO_2$, Ta, TiN, TaN, Ti and others. The conductive layer 152 is in electrical contact with the previously formed plugs 150 or, as previously mentioned, the Pt—Rh layer will itself be the lower-electrode.

Figure 8:
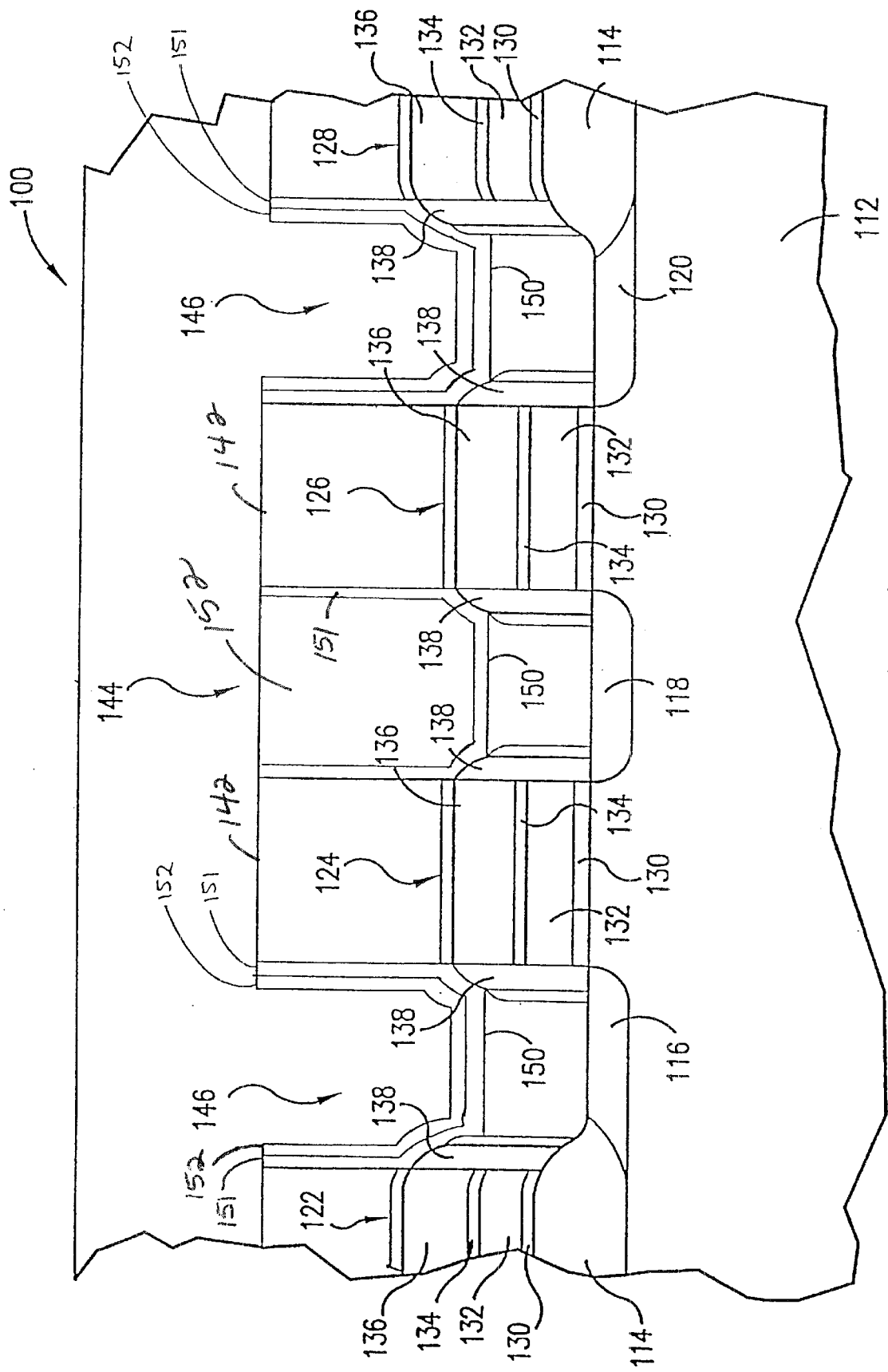
FIG. 8 is a diagrammatic cross-sectional view of a portion of a semiconductor wafer at a processing step subsequent to that shown in FIG. 7.
Figure 9:
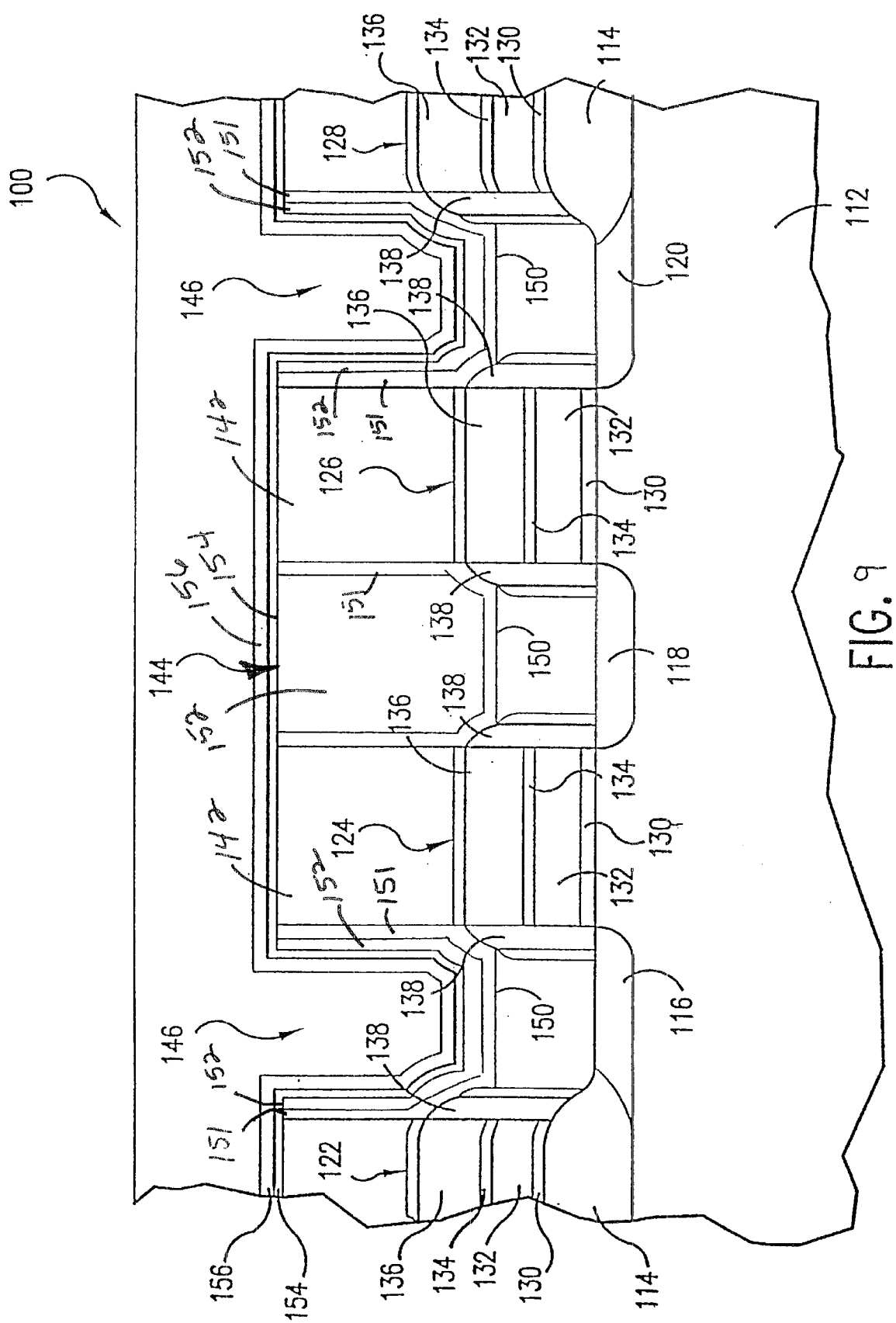
FIG. 9 is a diagrammatic cross-sectional view of a portion of a semiconductor wafer at a processing step subsequent to that shown in FIG. 8.

Referring to FIG. 8, the portion of the conductive layer 152 above the top of the BPSG layer 142 is removed through a planarized etching process, thereby electrically isolating the portions of layer 152 remaining in the bit line contact opening 144 and capacitor openings, 146. Referring now to FIG. 9, a capacitor dielectric layer 154 is provided over conductive layer 152 and capacitor openings, 146.

Dielectric layer 154 is deposited with a thickness such that the openings 146 are again not completely filled. Dielectric layer 154 may comprise tantalum pentoxide ($Ta_2O_5$). Other suitable dielectric materials such as Strontium Titanate (ST), Barium Strontium Titanate (BST), Lead Zirconium Titanate (PZT), Strontium Bismuth Tantalate (SBT) and Bismuth Zirconium Titanate (BZT) may also be used. Dielectric layer 154 may be deposited by a low-pressure CVD process using Ta$(OC_2H_5)_5$ and $O_2$ at about 430° C., and may be subsequently annealed in order to reduce leakage current characteristics.

A second conductive electrode layer 156 is then deposited by CVD over the dielectric layer 154, again at a thickness which less than completely fills the capacitor openings 146. The second conductive layer 156 may be comprised of TiN, Pt, or other conventional electrode materials, such as many of those previously described for use as conductive layer 152. In addition to serving as the top electrode or second plate of the capacitor, the second conductive layer 156 also forms the interconnection lines between the second plates of all capacitors.

Figure 10:
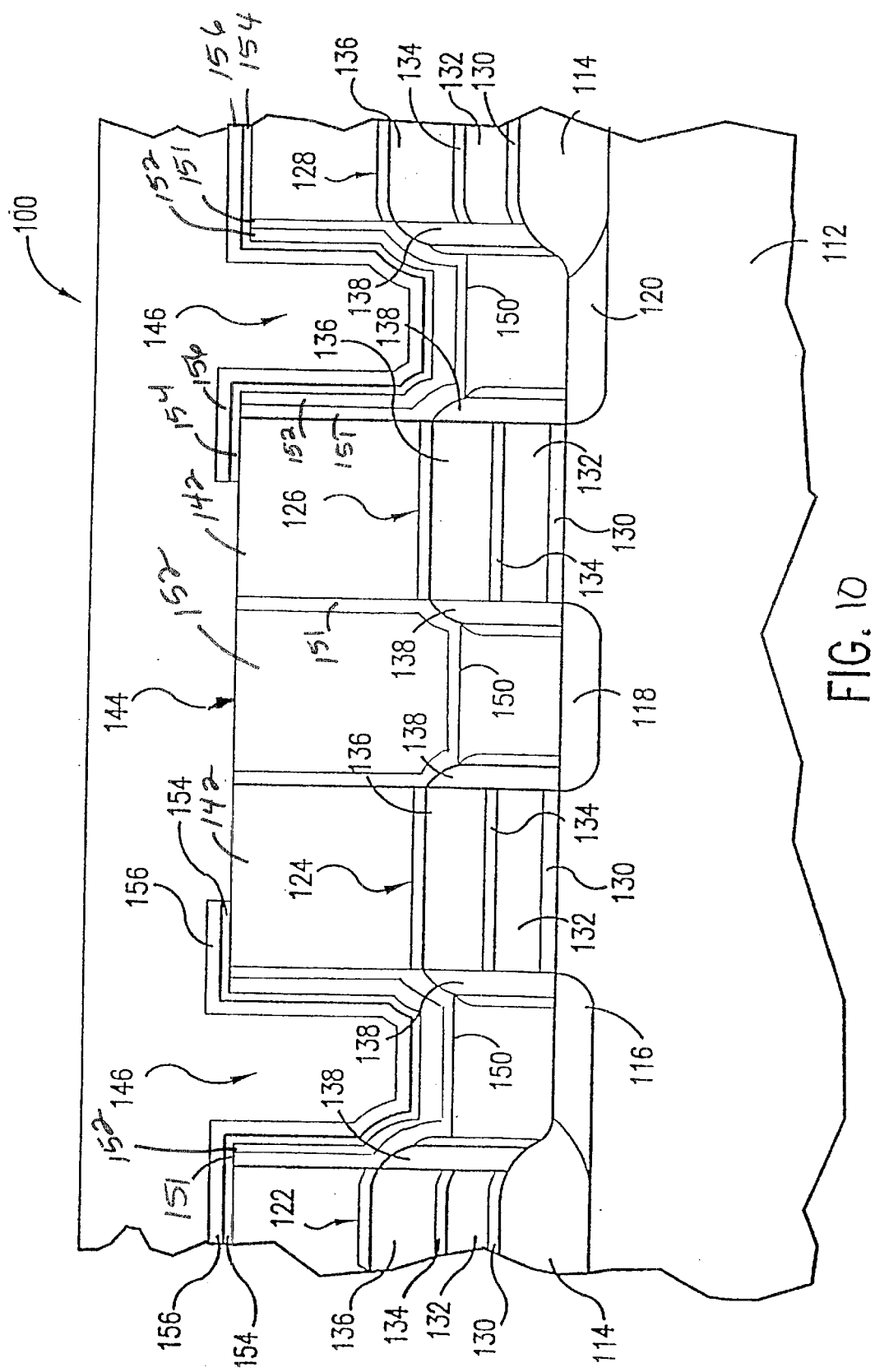
FIG. 10 is a diagrammatic cross-sectional view of a portion of a semiconductor wafer at a processing step subsequent to that shown in FIG. 9.

Referring to FIG. 10, the second conductive layer 156 and underlying capacitor dielectric layer 154 are patterned and etched such that the remaining portions of each group of the first conductive layer 152, capacitor dielectric layer 154, and second conductive layer 156 over the bit line contact opening 144 and capacitor openings, 146 are electrically isolated from each other. In this manner, each of the active areas 116, 118, 120 are also electrically isolated (without the influence of the gate). Furthermore, at last a portion of the barrier layer 151 and first conductive layer 152 in contact with the plug 150 over the bit line active area 118 are outwardly exposed.

Figure 11:
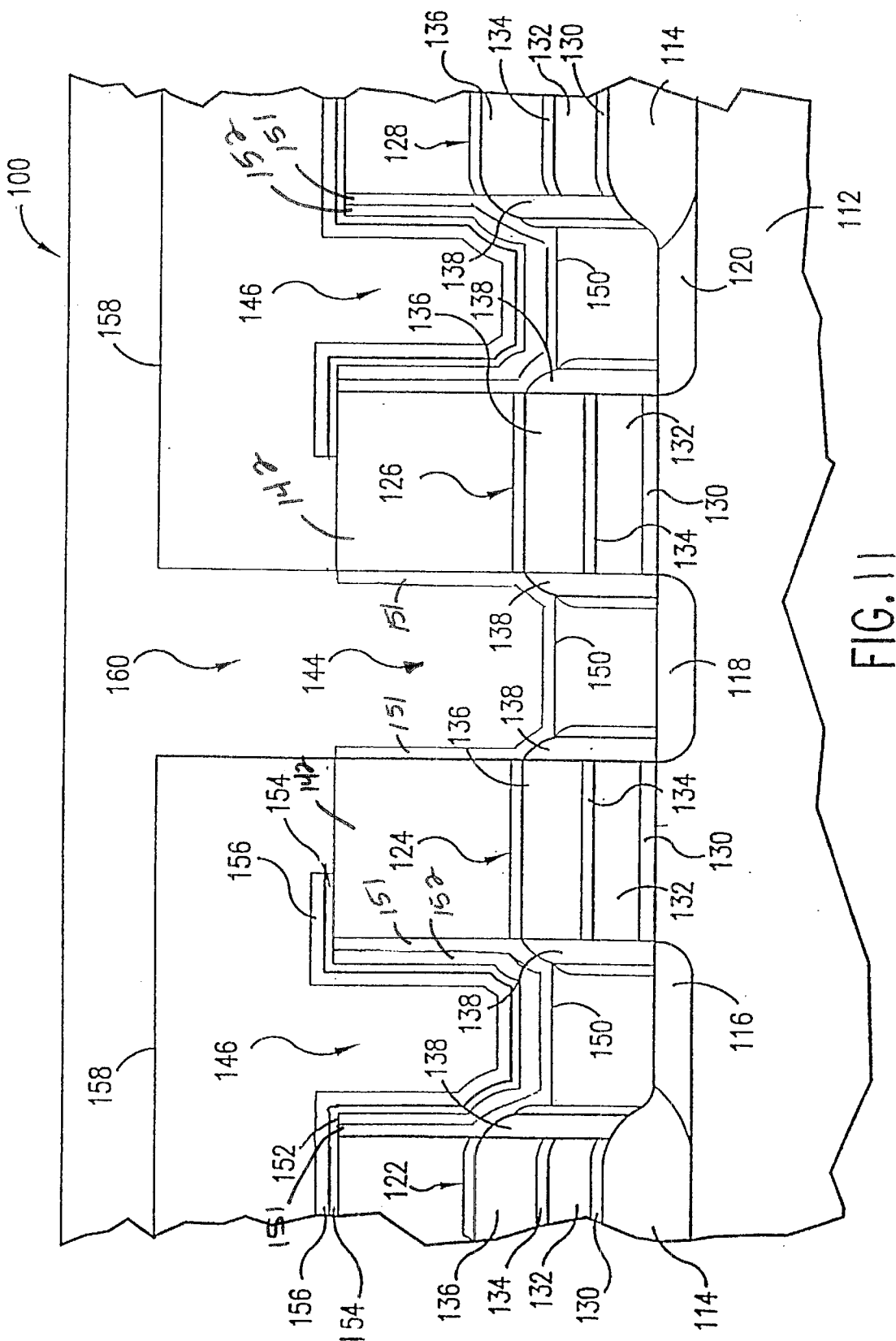
FIG. 11 is a diagrammatic cross-sectional view of a portion of a semiconductor wafer at a processing step subsequent to that shown in FIG. 10.

Referring now to FIG. 11, a bit line insulating layer 158 is provided over the second conductive layer 156. The bit line insulating layer 158 is preferably comprised of BPSG. The BPSG is typically reflowed by conventional techniques, i.e., heating to about 800° C. Other insulating layers such as PSG, or other compositions of doped $SiO_2$ may similarly be employed as the insulating layer 158.

A bit line contact opening 160 is patterned through the bit line insulating layer 158 such that the barrier layer 151 above conductive plug 150 is once again outwardly exposed. Then a bit line contact material is provided in the bit line contact opening 160 such that the bit line contact material is in electrical contact with the outwardly exposed portion of the barrier layer 151 above conductive plug 150. Thus, the plug 150 over the active area 118 common to both FETs acts as a bit line contact. The DRAM array and associated circuitry may then be completed by a variety of well established techniques, such as metalization, and attachment to peripheral circuitry.

Figure 13:
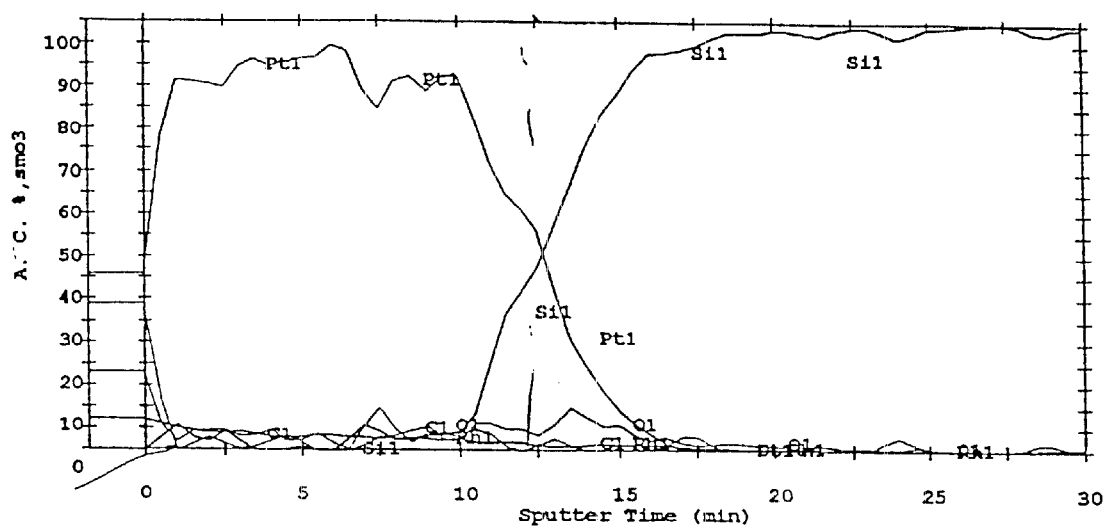
FIG. 13 shows an x-ray photoelectron spectroscopy (XPS) depth profile of co-deposited CVD Pt—Rh layer after rapid thermal oxidation (RTO) at 750° C. for 60 seconds.
Figure 14:
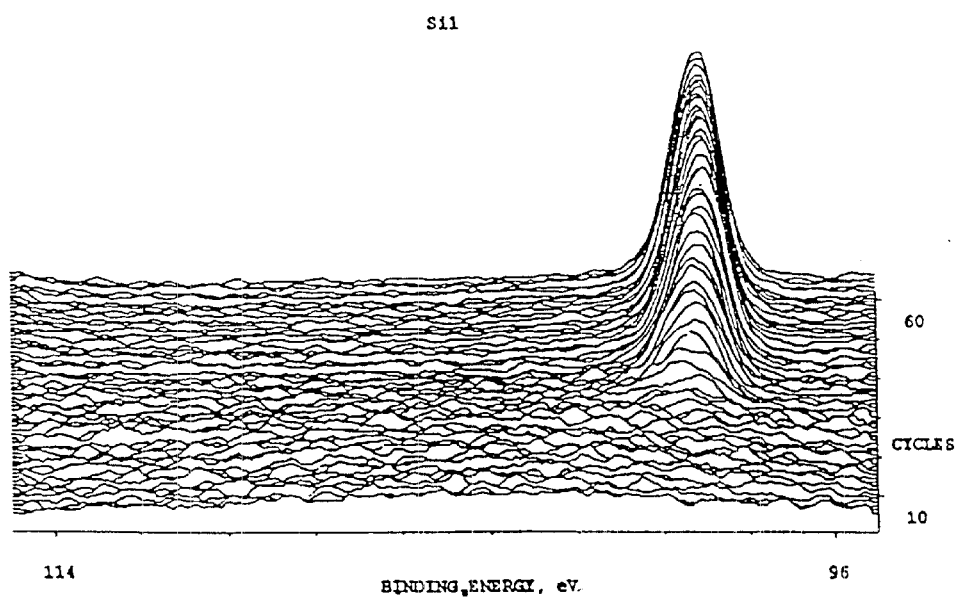
FIG. 14 shows an XPS montage display of the Si 2p photoelectron peak for CVD co-deposited Pt—Rh layer after RTO at 750° C.

The advantages of co-depositing Rh with Pt for the barrier layer 151 will now be discussed with references to FIGS. 13–17. FIG. 13 shows an XPS depth profile of a Pt—Rh alloy, produced by CVD co-deposition of Pt and Rh, after annealing in oxygen at 750° C. for 60 seconds. The rhodium concentration in the Ph—Rh layer is about 6%. FIG. 14 shows an XPS montage plot of the Si in the layer of FIG. 13, indicating the lack of oxygen at the Pt—Rh interface, and no Si at the surface.

Figure 15:
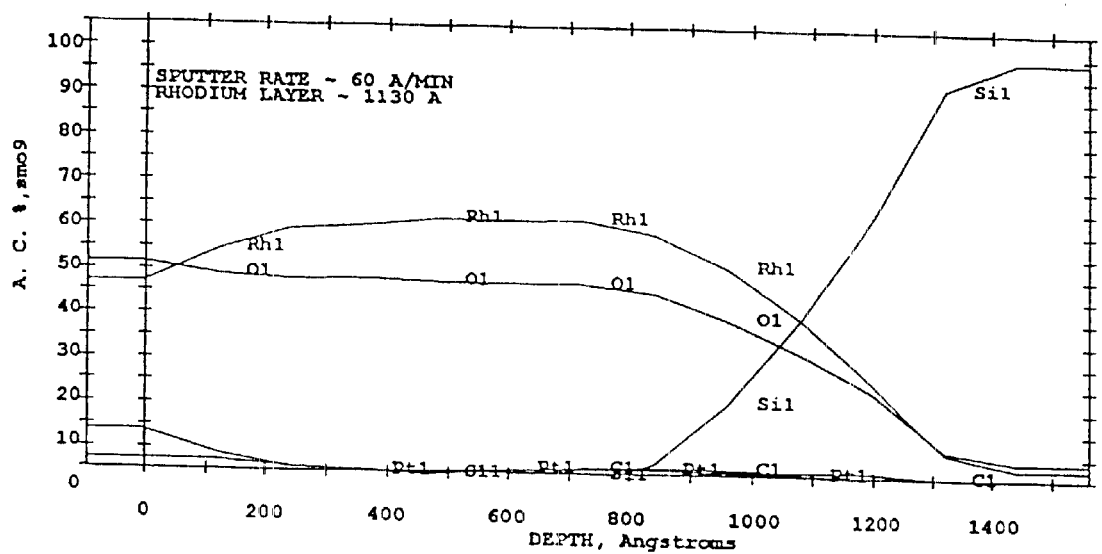
FIG. 15 shows the XPS profile of pure rhodium after RTO at 850° C., indicating a layer composed of rhodium oxide.
Figure 16:
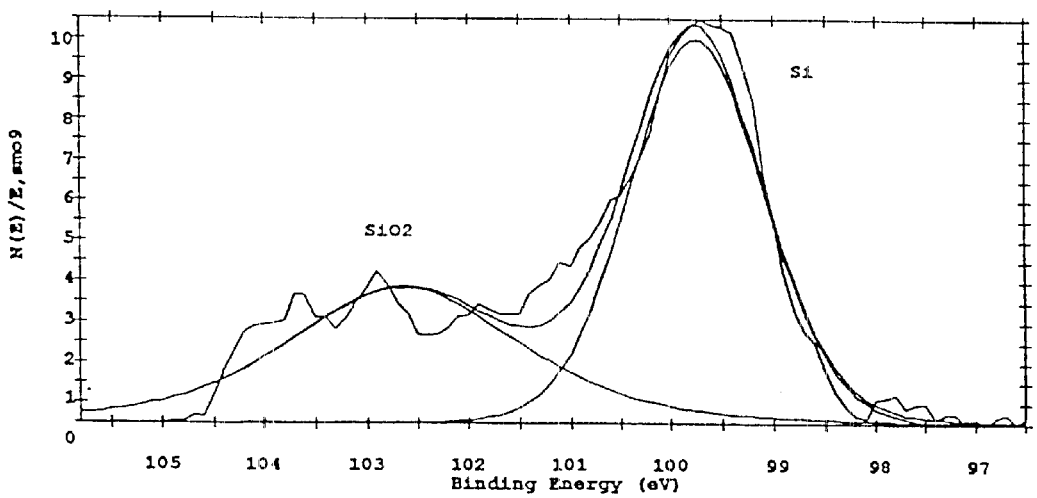
FIG. 16 shows the XPS spectra of the Si 2p peak from pure rhodium after RTO at 850° C.

FIG. 15 shows, for comparison, an XPS depth profile of a pure Rh layer (after RTO) for comparison of oxygen barrier properties. The surface had rhodium oxide present. The interface with silicon was composed of rhodium oxide, silicon oxide and rhodium silicide. FIG. 16 shows the XPS spectra of the Si2p peak at the Rh/Si interface on the layer of FIG. 15, indicating significant levels of $SiO_2$. Tables 1 and 2 show the composition of the layer at the rhodium/silicon interface. This data shows that after annealing in oxygen, Rh is present primarily as an oxide of rhodium, and silicon is present as atomic Si (58%) and $SiO_2$ (42%). Thus, the pure rhodium is at least partially permeable to oxygen, and the substrate is not passivated by the native oxide.

TABLE 1

| Element | Area cts-eV/s | Sensitivity Factor | Concentration (%) |
| --- | --- | --- | --- |
| C1s | 19 | 5.588 | 0.06 |
| O1s | 25659 | 14.162 | 33.70 |
| Si2p | 10239 | 6.197 | 30.73 |
| Rh3d | 174239 | 91.315 | 35.50 |

TABLE 2

| Band No. | Peak Pos. | Delta | Height | % FWHM | Total Gauss | Area | Area |
| --- | --- | --- | --- | --- | --- | --- | --- |
| 2 | 102.64 | 2.88 | 1218 | 2.70 | 54 | 4265 | 41.56 |
| 1 | 99.75 | 0.00 | 3448 | 1.56 | 90 | 5998 | 58.44 |

Figure 17:
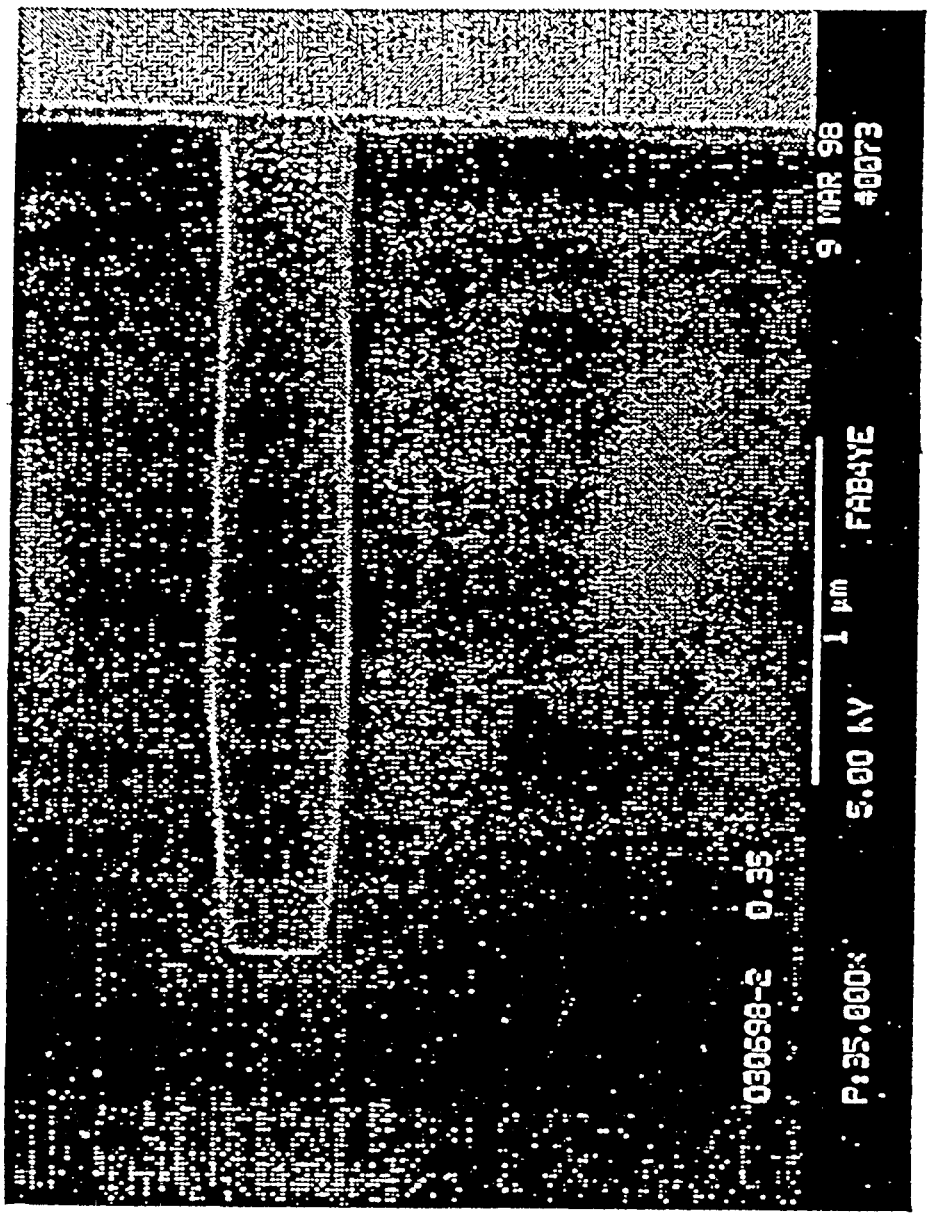
FIG. 17 is a scanning electron microscope (SEM) image of a co-deposited Pt—Rh layer on BPSG in a 0.35 diameter contact.

FIG. 17 is an SEM of CVD Pt—Rh co-deposited in a 0.35 um contact. The SEM demonstrates the good step coverage and conformality obtained from the co-deposited Pt—Rh alloy according to the invention. Conformality of the CVD Pt—Rh alloy barrier layers of the invention, as shown in FIG. 17, is about 35% step coverage on a 0.35 diameter by 2.4 micrometer contact. This level of conformality or better is characteristic of the CVD Pt—Rh alloy layers of the invention.

The Pt—Rh alloy barrier layer and electrode materials according to the invention also have excellent conductivity, and therefor reduce depletion effects and enhance frequency response. The materials possess excellent barrier properties for protection of cell dielectrics and substrate during oxidation/recrystallization steps for dielectrics and during BPGS reflow and other high temperature steps after capacitor formation. In addition, the Pt—Rh alloy barriers according to the invention also substantially prevent diffusion to protect cell dielectrics from interaction with Si and other surrounding materials which may degrade the dielectric materials or produce an additional $SiO_2$ dielectric layer; the series capacitance of $SiO_2$ would drastically reduce overall cell capacitance. Thus, the barriers/electrodes of the invention are not limited to use as barrier layers for bottom electrodes, but may also be employed both as top and bottom electrodes, and as additional barrier layers applied to any other top and/or bottom electrodes.

In addition, the use of the platinum and rhodium precursor compositions and methods of forming co-deposited Pt—Rh alloy layers of the present invention are beneficial for a wide variety of thin film applications in integrated circuit structures, particularly those using high dielectric materials. For example, such applications include capacitors such as planar cells, trench cells (e.g., double sidewall trench capacitors), stacked cells (e.g., crown, V-cell, delta cell, multi-fingered, or cylindrical container stacked capacitors).

Although a specific vapor deposition process is described by reference to FIG. 12, methods of the present invention are not limited to the specific vapor deposition system shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims. All patents, patent applications, and publications referred to herein are incorporated herein by reference as if each were individually incorporated by reference.

What is claimed is:

1. A capacitor comprising a first electrode, a dielectric layer, and a second electrode, wherein at least one of said first or second electrodes consists of a single layer comprising a CVD platinum-rhodium alloy.

2. The capacitor of claim 1 wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

3. The capacitor of claim 1 wherein said dielectric layer comprises $Ta_2O_5$.

4. The capacitor of claim 1 wherein said capacitor is a container capacitor.

5. A capacitor comprising a dielectric layer, a first electrode, a second electrode, and a conductive barrier layer comprising a CVD platinum-rhodium alloy adjacent said first electrode, wherein said first electrode does not comprise a platinum-rhodium alloy.

6. The capacitor of claim 5, wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

7. The capacitor of claim 5 wherein said first electrode is interposed between said dielectric and said barrier layer.

8. The capacitor of claim 5 wherein said barrier layer is interposed between said dielectric and said first electrode.

9. The capacitor of claim 5 wherein said dielectric layer comprises $Ta_2O_5$.

10. The capacitor of claim 6 wherein said capacitor comprises a container capacitor.

11. An integrated circuit comprising a capacitor, said capacitor comprising a first electrode, a dielectric layer, and a second electrode, wherein at least one of said first or second electrodes consists of a single layer comprising a CVD platinum-rhodiumn alloy.

12. The integrated circuit of claim 11 wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

13. The integrated circuit of claim 11 wherein said dielectric layer comprises $Ta_2O_5$.

14. The integrated circuit of claim 11 wherein said capacitor is a container capacitor.

15. An integrated circuit comprising a capacitor, said capacitor comprising a dielectric layer, a first electrode, a second electrode, and a conductive barrier layer comprising a CVD platinum-rhodium alloy adjacent said first electrode, wherein said first electrode does not comprise a platinum-rhodium alloy.

16. The integrated circuit of claim 15, wherein the capacitor is a container capacitor.

17. The integrated circuit of claim 15, wherein the circuit is a memory circuit.

18. The integrated circuit of claim 17, wherein the circuit is a dynamic random access memory circuit.

19. A memory cell comprising:

a transistor; and a capacitor comprising a first electrode, a second electrode, and a diffusion barrier layer comprising a CVD platinum-rhodium alloy adjacent said first electrode, wherein said first electrode does not comprise a platinum-rhodium alloy.

20. The memory cell of claim 19, wherein said capacitor further comprises a dielectric layer selected from the group consisting of tantalum pentoxide ($Ta_2O_5$), Strontium Titanate (ST), Barium Strontium) Titanate (BST), Lead Zirconium Titanate (PZT), Strontium Bismuth Titanate (SBT) and Bismuth Zirconium Titanate (BZT).

* * * * *

UNITED STATES PATENT AND TRADEMARK OFFICE
CERTIFICATE OF CORRECTION

PATENT NO. : 6,690,055 B1
DATED : February 10, 2004
INVENTOR(S) : Uhlenbrock et al.

It is certified that error appears in the above-identified patent and that said Letters Patent is hereby corrected as shown below:

Column 4,
Line 4, please delete "as" and insert -- gas --.

Column 5,
Line 27, please delete "wafer processing" and insert -- wafer at a processing --.
Lines 31 and 34, please delete "wafer a processing" and insert -- wafer at a processing --.

Column 10,
Line 43, please delete "250-254" and insert -- 250-253 --.

Column 13,
Line 67, please delete "at last" and insert -- at least --.

Signed and Sealed this

Twenty-second Day of February, 2005

JON W. DUDAS
*Director of the United States Patent and Trademark Office*